United States Patent
Fujii

(10) Patent No.: US 11,257,777 B2
(45) Date of Patent: Feb. 22, 2022

(54) SEMICONDUCTOR DEVICE

(71) Applicant: Rohm Co., Ltd., Kyoto (JP)

(72) Inventor: Kenji Fujii, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 12 days.

(21) Appl. No.: 16/671,731

(22) Filed: Nov. 1, 2019

(65) Prior Publication Data

US 2020/0144211 A1    May 7, 2020

(30) Foreign Application Priority Data

Nov. 7, 2018    (JP) .............................. JP2018-209394

(51) Int. Cl.
*H01L 23/00* (2006.01)
*H01L 23/495* (2006.01)
*H01L 23/31* (2006.01)

(52) U.S. Cl.
CPC .......... *H01L 24/16* (2013.01); *H01L 23/3107* (2013.01); *H01L 23/49548* (2013.01); *H01L 24/13* (2013.01); *H01L 24/29* (2013.01); *H01L 24/73* (2013.01); *H01L 2224/13124* (2013.01); *H01L 2224/13147* (2013.01); *H01L 2224/16059* (2013.01); *H01L 2224/16245* (2013.01); *H01L 2224/29139* (2013.01); *H01L 2224/29147* (2013.01); *H01L 2224/73203* (2013.01)

(58) Field of Classification Search
CPC ............... H01L 24/16; H01L 23/49548; H01L 23/3107; H01L 24/73; H01L 24/13; H01L 24/29; H01L 2224/29147; H01L 2224/16245; H01L 2224/73203; H01L 2224/05147; H01L 2224/11462; H01L 23/495–49596; H01L 21/4821–4842; H01L 23/49861; H01L 2224/32245–3226
See application file for complete search history.

(56) References Cited

U.S. PATENT DOCUMENTS

| 3,983,293 | A | * | 9/1976 | Ohuchi | .................... | C03B 9/34 |
|           |   |   |        |        |                     | 428/550   |
| 2012/0188735 | A1 | * | 7/2012 | Hiroshima | .............. | H05K 1/181 |
|           |   |   |        |        |                     | 361/767   |
| 2013/0082334 | A1 | * | 4/2013 | Nakamura | ............ | H01L 27/088 |
|           |   |   |        |        |                     | 257/401   |

(Continued)

FOREIGN PATENT DOCUMENTS

JP    2018-85522 A    5/2018

*Primary Examiner* — Shahed Ahmed
(74) *Attorney, Agent, or Firm* — Hamre, Schumann, Mueller & Larson, P.C.

(57) ABSTRACT

A semiconductor device includes an electric conductor, a semiconductor element, and a bonding layer. The electric conductor has a main surface and a rear surface opposite to the main surface in a thickness direction. The semiconductor element includes a main body and electrodes. The main body has a side facing the main surface of the conductor, and the electrodes each protrude toward the main surface from the side of the main body to be electrically connected to the main surface. The bonding layer is held in contact with the main surface and the electrodes. Each electrode includes a base portion in contact with the main body, and a columnar portion protruding toward the main surface from the base portion to be held in contact with the bonding layer, which is a sintered body of a metal powder.

16 Claims, 16 Drawing Sheets

(56) References Cited

U.S. PATENT DOCUMENTS

| | | | |
|---|---|---|---|
| 2014/0001620 A1* | 1/2014 | Shimizu | H01L 23/49541 257/676 |
| 2015/0171066 A1* | 6/2015 | Yamamichi | H01L 23/3142 257/411 |
| 2016/0336277 A1* | 11/2016 | Kageyama | H01L 23/4952 |
| 2017/0085006 A1* | 3/2017 | Corman | H01Q 21/24 |
| 2021/0074624 A1* | 3/2021 | Hohlfeld | H01L 23/3672 |

* cited by examiner

SEMICONDUCTOR DEVICE

FIELD

The present disclosure relates to a semiconductor device in which a semiconductor element is electrically bonded to conductive members through flip-chip bonding.

BACKGROUND

Semiconductor devices in which a semiconductor element is electrically bonded to conductive members (leads or the like) through flip-chip bonding have conventionally been widely known. JP-A-2018-85522 discloses an example of such a semiconductor device.

In the conventional semiconductor device, multiple electrodes of the semiconductor element (in JP-A-2018-85522, a semiconductor chip) are electrically bonded to conductive members (drawn-out wires) by a bonding layer (conductive bumps). The multiple electrodes of the semiconductor element oppose the conductive members.

In general, solder is often used for the bonding layer. For example, as the melting point of lead-free solder is 217° C., solder is a conductor with a relatively low melting point. In this case, when the semiconductor apparatus is used for a long period, electromigration may occur in the bonding layer using the solder. Electromigration tends to occur in conductors with a relatively low melting point. Electromigration is a phenomenon in which loss such as a void is generated in a conductor due to ions gradually moving since momentum is exchanged between the electrons moving in the conductor and the metal atoms.

Accompanying a reduction in the size of semiconductor elements and an increase in integration of circuits formed inside of a semiconductor element in recent years, multiple electrodes of a semiconductor element have tended to decrease in size and increase in number. When electromigration occurs in a bonding layer used to bond these multiple electrodes and conductive members, a decrease in the strength with which the multiple electrodes are bonded to the conductive members and an increase in the parasitic resistance of the semiconductor apparatus cannot be ignored. Note that electromigration is more likely to occur also due to the current concentration in the conductor increasing.

SUMMARY

In view of the above-described circumstances, the present disclosure aims to provide a semiconductor device that can suppress the occurrence of electromigration in a bonding layer used for flip-chip bonding.

According to an aspect of the present disclosure, there is provided a semiconductor device that includes: an electric conductor having a main surface and a rear surface that face mutually opposite sides in a thickness direction; a semiconductor element including an element main body and a plurality of electrodes, where the element main body has a first side facing the main surface of the conductor, and the plurality of electrodes each protrude toward the main surface from the first side of the element main body to be electrically connected to the main surface; and a bonding layer held in contact with the main surface and the plurality of electrodes. Each of the plurality of electrodes includes: a base portion in contact with the element main body; and a columnar portion protruding toward the main surface from the base portion and held in contact with the bonding layer. The bonding layer is a sintered body of a metal powder.

Preferably, the columnar portion of each electrode includes a leading end surface facing the main surface and a side surface connected to the leading end surface and facing in a direction orthogonal to the thickness direction, where the bonding layer is in contact with the leading end surface and the side surface.

Preferably, the semiconductor element includes an outer surface protection film that covers the first side of the element main body, and the leading end surface of each electrode is located between the main surface and the outer surface protection film in the thickness direction.

Preferably, the outer surface protection film is in contact with the base portion and the columnar portion of each electrode.

Preferably, the outer surface protection film is spaced apart from the columnar portion of each electrode.

Preferably, the columnar portion of each electrode is provided with a recessed portion that is recessed toward the element main body from the leading end surface, and the bonding layer is in contact with the recessed portion.

Preferably, the leading end surface of each electrode has a protruding shape that bulges toward the main surface.

Preferably, the base portion of each electrode is made of a material including aluminum, or a material including copper.

Preferably, the metal powder includes silver or copper.

Preferably, the electric conductor includes: a plurality of first leads that extend in a first direction orthogonal to the thickness direction and are separated from each other in a second direction orthogonal to the thickness direction and the first direction; and a plurality of second leads that are located offset from the plurality of first leads in the second direction. The semiconductor element includes a semiconductor substrate and a semiconductor layer disposed on the semiconductor substrate and facing the main surface. The semiconductor layer is formed with a switching circuit and a control circuit electrically connected to the switching circuit. The plurality of electrodes include a plurality of first electrodes and a plurality of second electrodes. The plurality of first electrodes are electrically connected to the switching circuit and are electrically connected to the plurality of first leads. The plurality of second electrodes are electrically connected to the control circuit, and at least part of the plurality of second electrodes is electrically connected to the plurality of second leads.

Preferably, the semiconductor device further includes a sealing resin that covers a part of each first lead, a part of each second lead and the semiconductor element. The sealing resin has: a bottom surface that faces a same side as the rear surface in the thickness direction; and a pair of first side surfaces that are connected to the bottom surface and are spaced apart from each other in the first direction. The plurality of first leads each include a main portion that extends in the first direction and a pair of side portions that are connected to ends of the main portion in the first direction. Each of the pair of side portions has a first end surface that faces in the first direction. The rear surface of each first lead is exposed from the bottom surface. The first end surfaces are exposed from the pair of first side surfaces so as to be flush with the first side surfaces. The dimension in the second direction of the pairs of first end surfaces is smaller than the dimension in the second direction of the rear surfaces of the main portions.

Preferably, each of the pair of side portions is provided with wedge portions that extend from the main surface to the rear surface and are recessed inward of the side portions from both sides in the second direction.

Preferably, each of the pair of side portions is provided with a notch portion that extends from the main surface to the rear surface, is recessed in the first direction from the first end surface, and divides the first end surface into two regions.

Preferably, each of the plurality of second leads includes a second end surface facing in the second direction. The sealing resin includes a pair of second side surfaces that are connected to the bottom surface and the pair of first side surfaces and are spaced apart from each other in the second direction. The rear surfaces of the plurality of second leads are exposed from the bottom surface. The plurality of second end surfaces are exposed from one of the second side surfaces so as to be flush with the one of the second side surfaces.

Preferably, one of the plurality of first leads is formed with a plurality of protruding portions that protrude from the main portion of the one of the plurality of first leads. Each of the plurality of protruding portions includes an auxiliary end surface that faces in the second direction. The auxiliary end surface of each protruding portion is exposed from the other of the second side surfaces so as to be flush with the other of the second side surfaces.

According to the semiconductor device of the present disclosure, it is possible to suppress the occurrence of electromigration in a bonding layer used in flip-chip bonding.

Other features and advantages of the present disclosure will become more evident through detailed description given below with reference to the accompanying drawings.

EMBODIMENTS

Embodiments of the present disclosure will be described with reference to the accompanying drawings.

Figure 1:
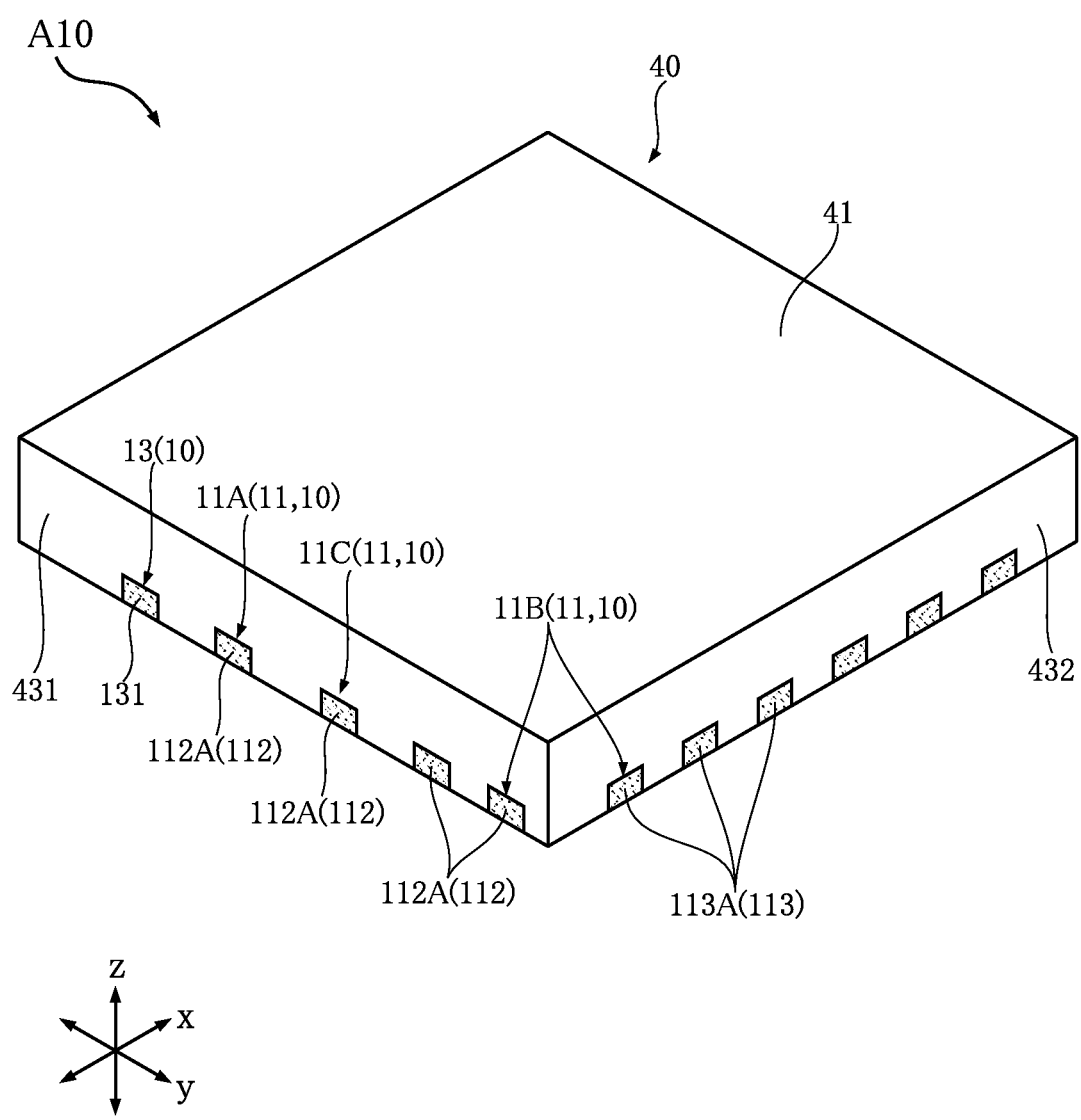
FIG. 1 is a perspective view of a semiconductor device according to a first embodiment.
Figure 2:
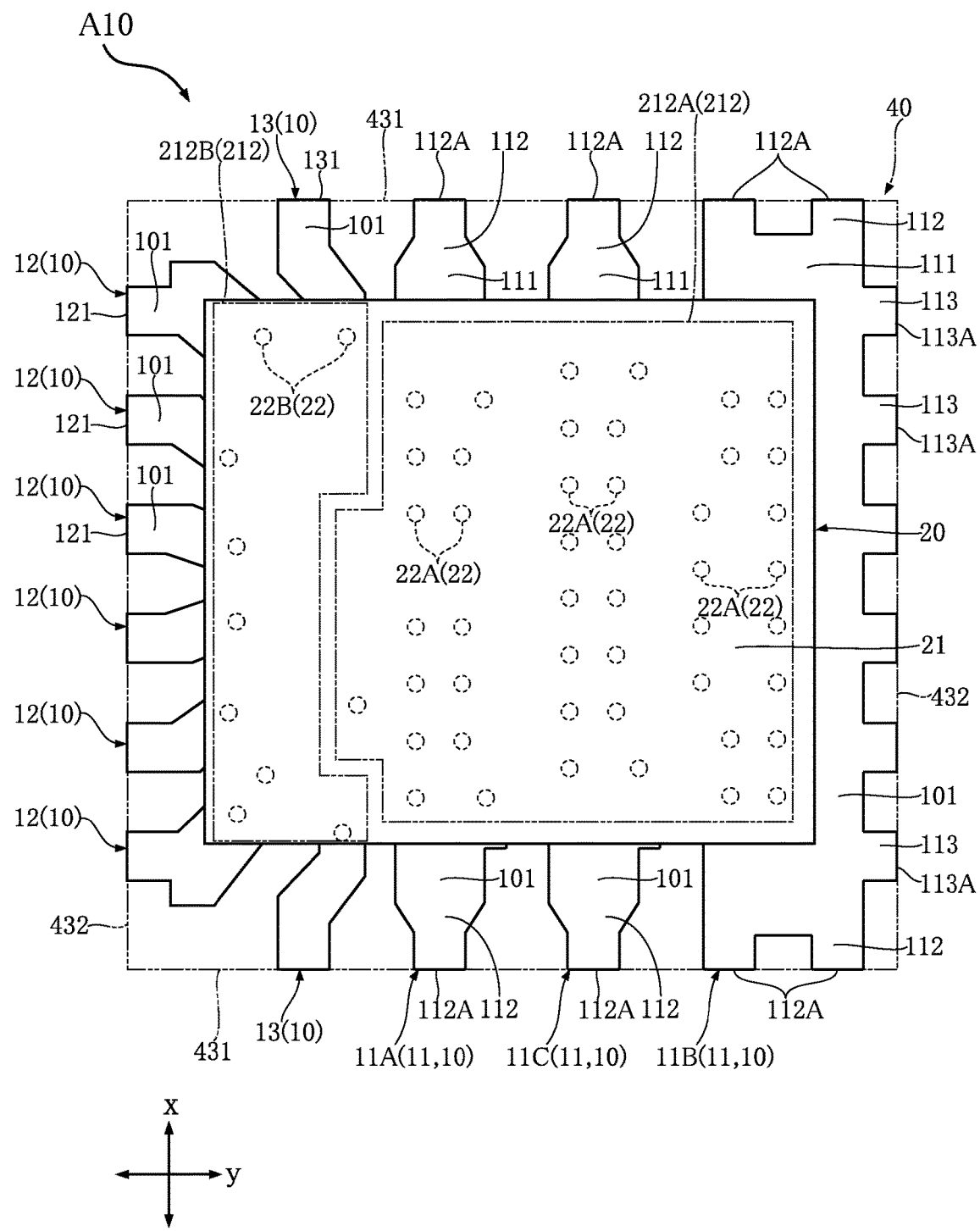
FIG. 2 is a plan view of the semiconductor device shown in FIG. 1 (sealing resin is shown transparent).
Figure 3:
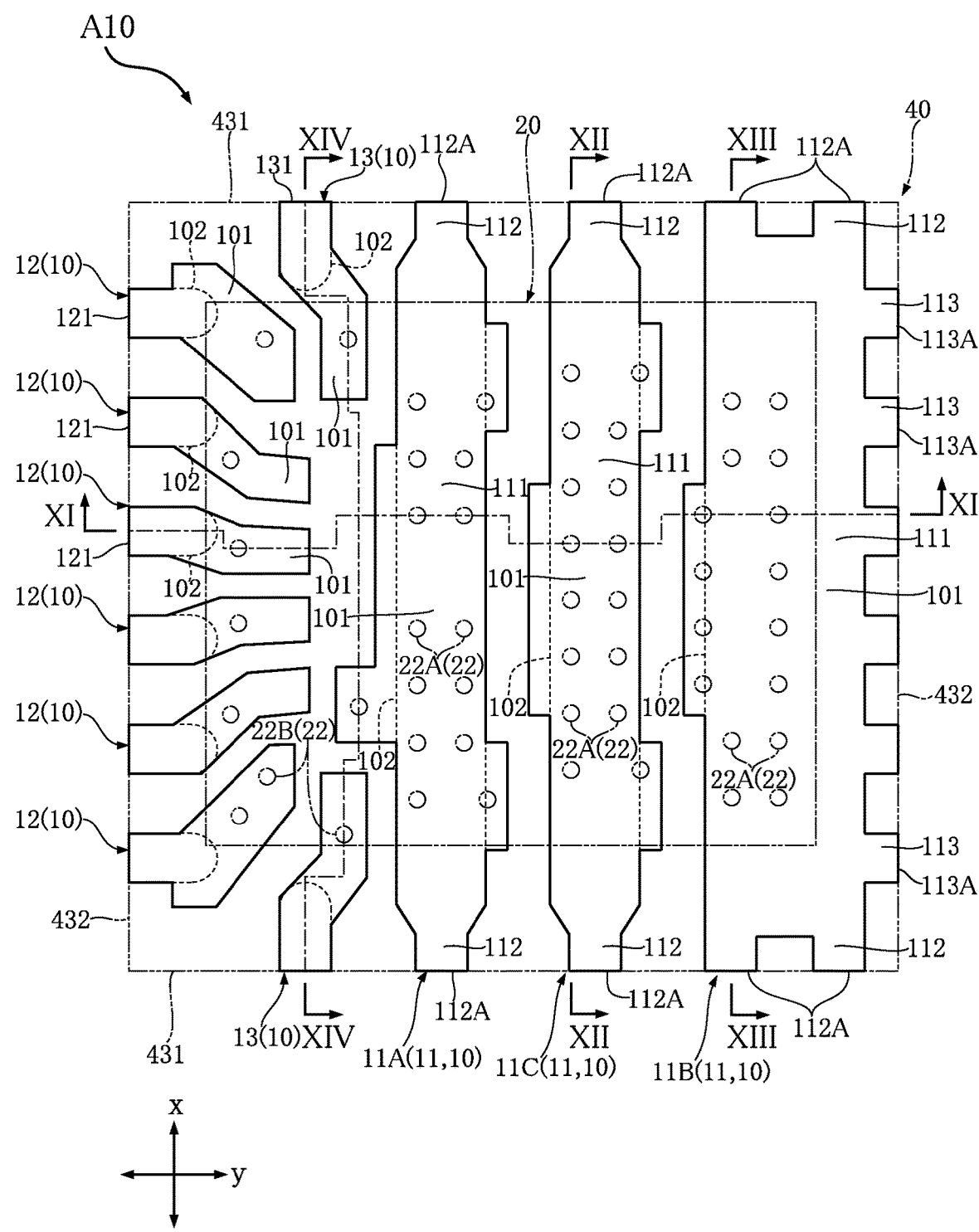
FIG. 3 is a plan view of the semiconductor device shown in FIG. 1 (a semiconductor element and sealing resin are shown transparent).

A semiconductor device A10 according to a first embodiment will be described with reference to FIGS. 1 to 16. The semiconductor device A10 includes conductive members 10, a semiconductor element 20, a bonding layer 30, and sealing resin 40. As shown in FIG. 1, the package format of the semiconductor device A10 is QFN (Quad For Non-Lead Package). The semiconductor element 20 is a flip-chip LSI. A switching circuit 212A and a control circuit 212B (each of which will be described in detail later) are included inside of the semiconductor element 20. In the semiconductor device A10, direct-current electrical power (voltage) is converted into alternating-current electrical power (voltage) by the switching circuit 212A. The semiconductor device A10 is used as an element included in a circuit of a DC/DC converter, for example. Here, in FIG. 2, the sealing resin 40 is shown transparent to facilitate understanding. In FIG. 3, the semiconductor element 20 and the sealing resin 40 are shown transparent in order to facilitate understanding. In these drawings, the semiconductor element 20 and sealing resin 40, which are shown transparent, are indicated by virtual lines (two-dot chain lines).

In the description of the semiconductor device A10, a thickness direction z of the conductive member 10 may be referred to as "thickness direction z". The direction orthogonal to the thickness direction z may be referred to as "first direction x". The direction orthogonal to both the thickness direction z and the first direction x may be referred to as "second direction y". As shown in FIGS. 1 and 2, the semiconductor device A10 has a square shape in a view in the thickness direction z. Also, in the description of the semiconductor device A10, for the sake of convenience, the side in the second direction y on which multiple second leads 12 (described in detail later) are located will be referred to as "one side in the second direction y". The side in the second direction y on which multiple first leads 11 (described in detail later) are located will be referred to as "other side in the second direction y".

As shown in FIG. 2, the conductive members 10 are terminals for supporting the semiconductor element 20 and mounting the semiconductor device A10 on a wiring substrate. As shown in FIGS. 11 to 14, some of the conductive members 10 are covered by the sealing resin 40. The conductive members 10 each have a main surface 101 and a rear surface 102 that face mutually opposite directions in the thickness direction z. The main surfaces 101 face one side in the thickness direction z and oppose the semiconductor element 20. The semiconductor element 20 is supported by the main surfaces 101. The main surfaces 101 are covered by the sealing resin 40. The rear surfaces 102 face the other side in the thickness direction z. The conductive members 10 are formed from a single lead frame. The constituent material of the lead frame is, for example, copper (Cu) or a copper alloy. The conductive members 10 include multiple first leads 11, multiple second leads 12, and a pair of third leads 13.

Figure 4:
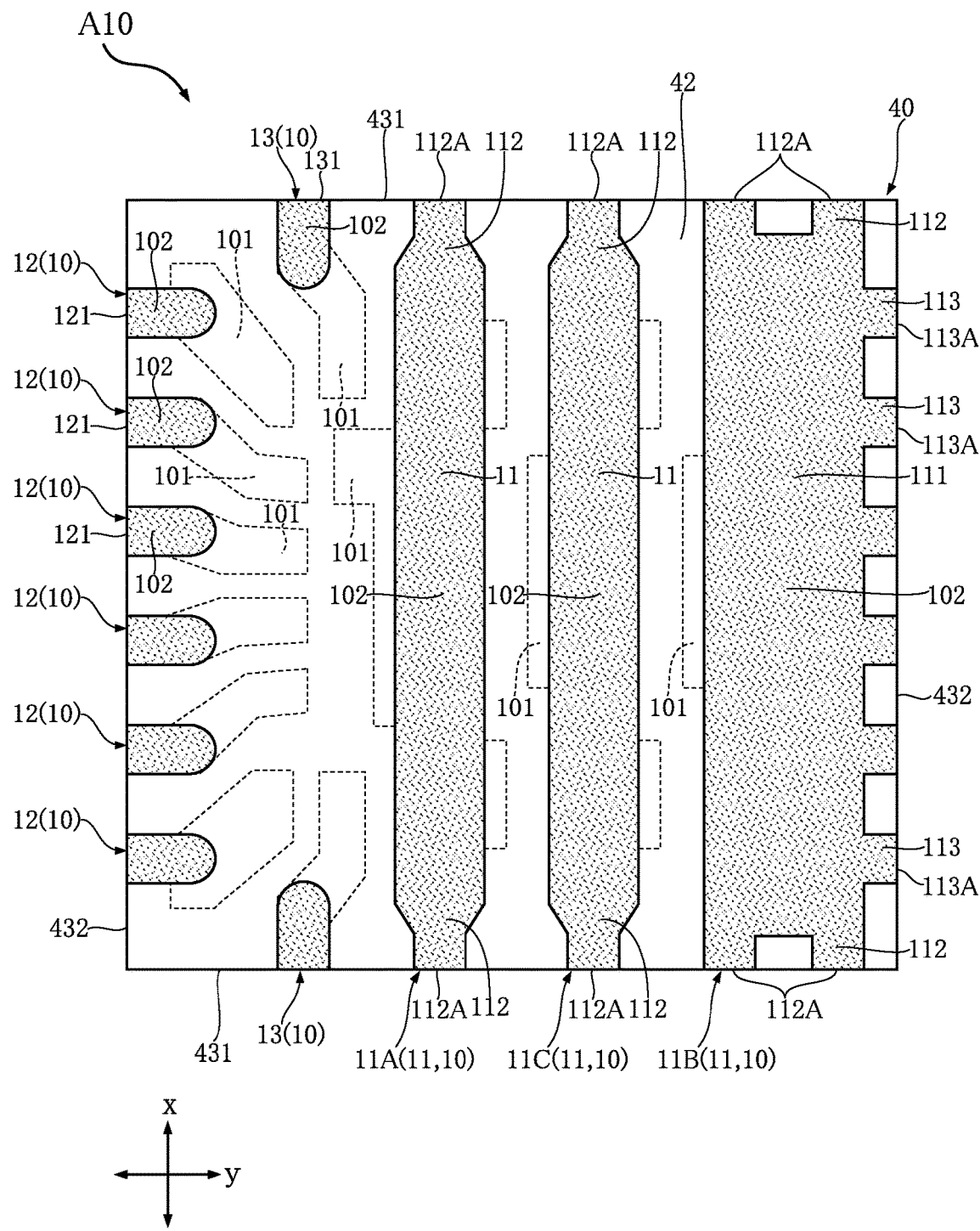
FIG. 4 is a bottom view of the semiconductor device shown in FIG. 1.

As shown in FIGS. 3 and 4, the multiple first leads 11 have band shapes that extend in the second direction y in a view in the thickness direction z. The multiple first leads 11 are aligned in the second direction y. In the example indicated by the semiconductor apparatus A10, the multiple first leads 11 are constituted by three terminals, namely a first input terminal 11A, a second input terminal 11B, and an output terminal 11C. The multiple first leads 11 are arranged in the following order from the one side to the other side in the second direction y: the first input terminal 11A, the output terminal 11C, the second input terminal 11B. The first input terminal 11A and the second input terminal 11B receive input of direct-current electrical power (voltage), which is to be subjected to power conversion in the semiconductor apparatus A10. The first input terminal 11A is a cathode (P terminal). The second input terminal 11B is an anode (N terminal). The output terminal 11C outputs an alternating-current electrical power (voltage) resulting from power conversion performed by the switching circuit 212A included in the semiconductor element 20.

As shown in FIG. 3, the first input terminal 11A is located between the multiple second leads 12 and the output terminal 11C in the second direction y. The output terminal 11C is located between the first input terminal 11A and the second input terminal 11B in the second direction y. The first input terminal 11A and the output terminal 11C each include a main portion 111 and a pair of side portions 112. As shown in FIGS. 3 and 4, the main portion 111 extends in the first direction x. In the multiple first leads 11, the semiconductor element 20 is supported by the main surfaces 101 of the main portions 111. The pair of side portions 112 are connected to both ends in the first direction x of the main portion 111. As shown in FIGS. 3, 4, 12, and 13, each of the pairs of side portions 112 has first end surfaces 112A. The first end surfaces 112A are connected to both the main surfaces 101 and the rear surfaces 102 of the first leads 11, and face in the first direction x. The first end surfaces 112A are exposed from the sealing resin 40.

Figure 9:
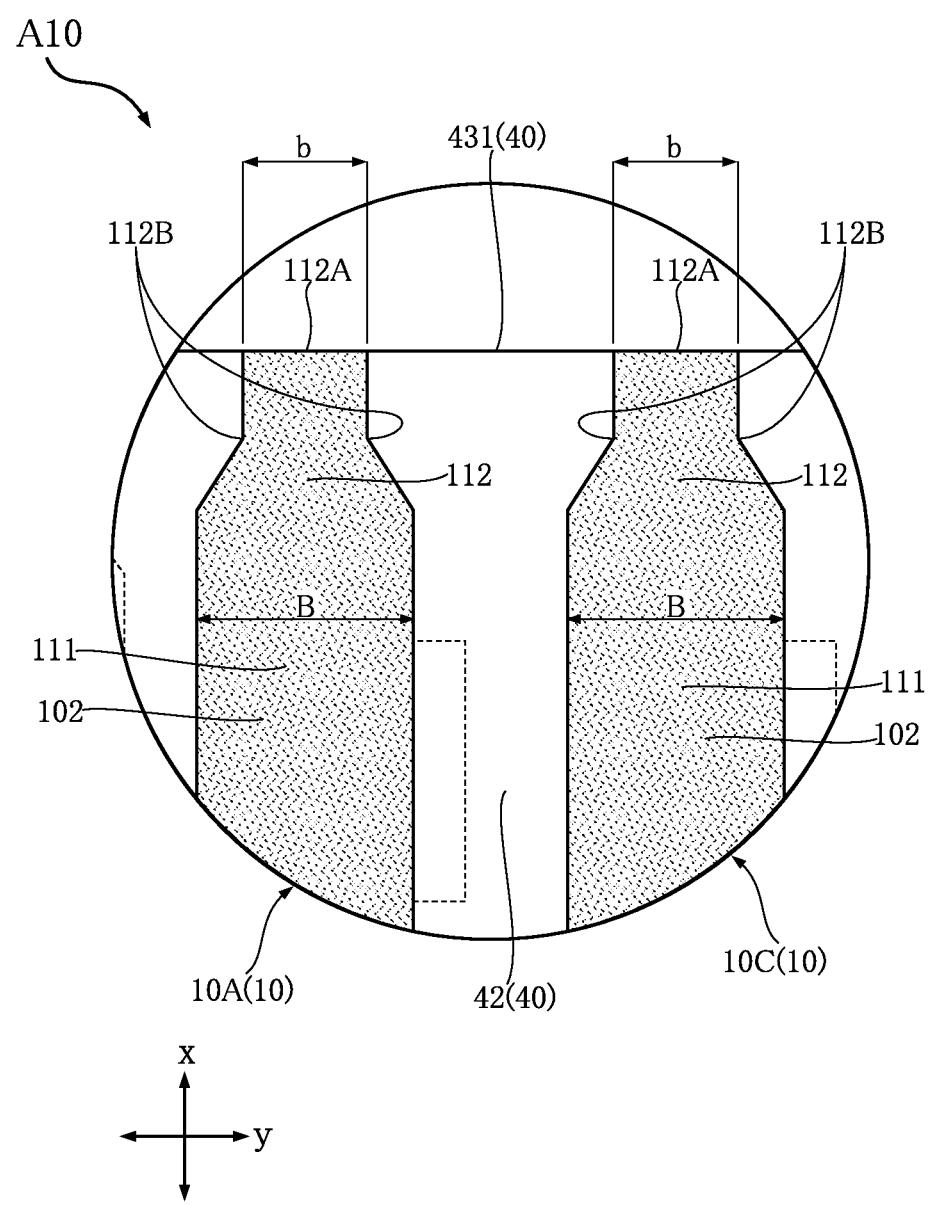
FIG. 9 is a partially enlarged view of FIG. 3.

As shown in FIG. 9, wedge portions 112B are formed on each of the pairs of side portions 112 of the first input terminal 11A and the output terminal 11C. The wedge portions 112B extend from the main surfaces 101 to the rear surfaces 102 of the first leads 11 and are recessed inward of the side portions 112 from both sides in the second direction y. The wedge portions 112B are in contact with the sealing resin 40. Due to the wedge portions 112B, in the first input terminal 11A and the output terminal 11C, a dimension b in the second direction y of each of the pair of first end surfaces 112A is smaller than a dimension B in the second direction y of the rear surface 102 of the main portion 111.

Figure 7:
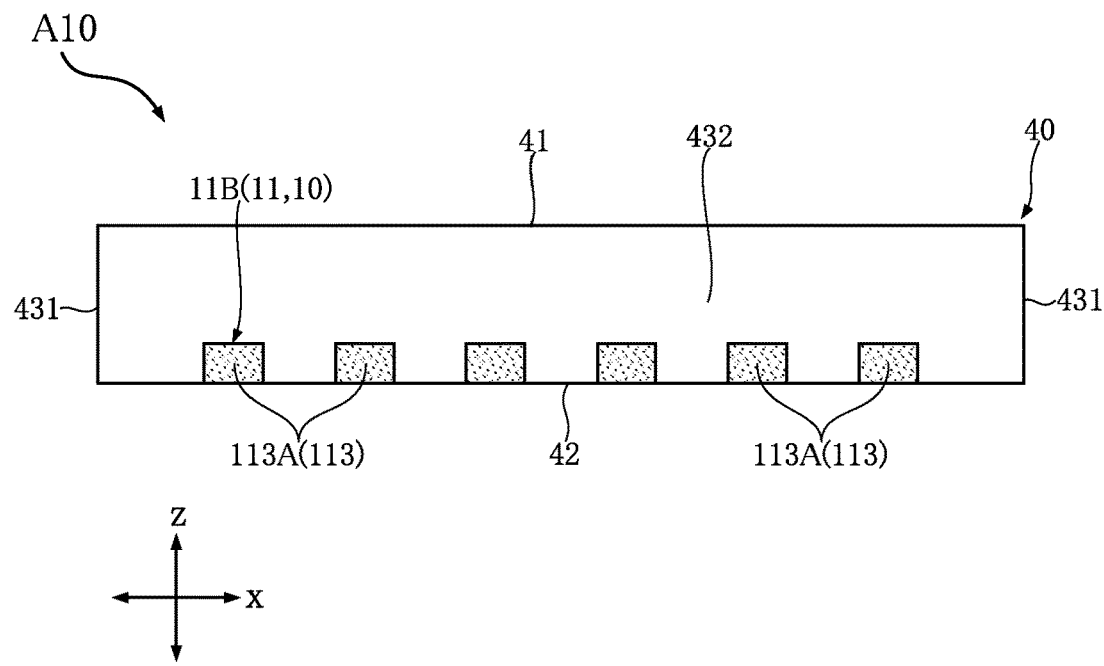
FIG. 7 is a right-side view of the semiconductor device shown in FIG. 1.
Figure 12:
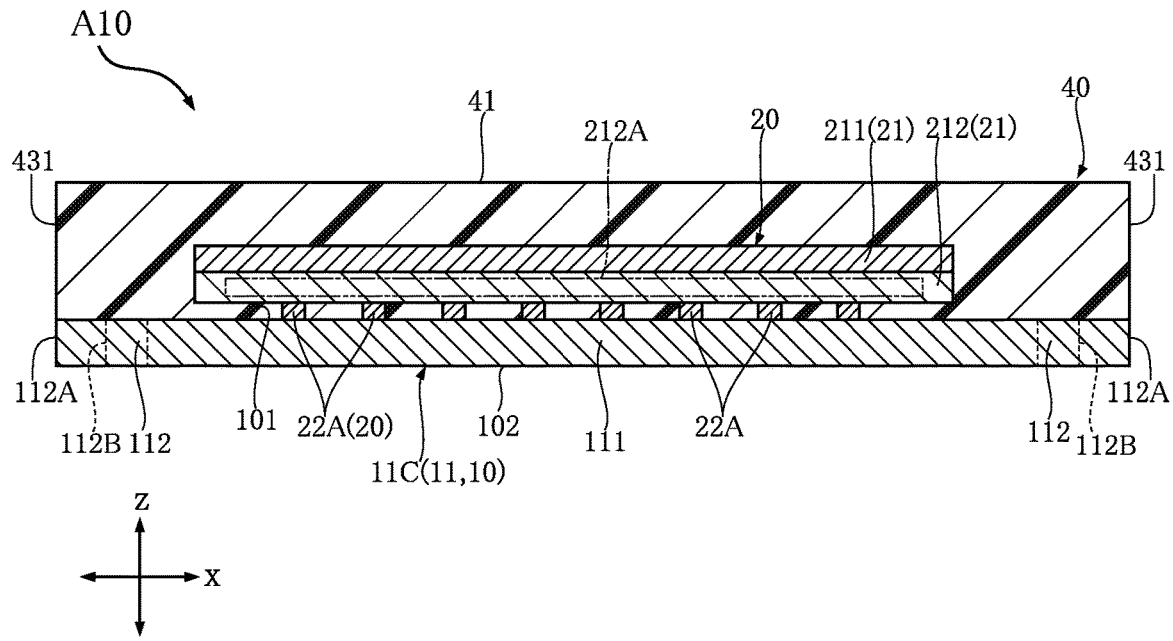
FIG. 12 is a cross-sectional view taken along line XII-XII in FIG. 3.

As shown in FIG. 3, the second input terminal 11B is located on the other side in the second direction y with respect to the output terminal 11C. For this reason, the second input terminal 11B is located on the other side in the second direction y among the multiple first leads 11. The second input terminal 11B includes a main portion 111, a pair of side portions 112, and multiple protruding portions 113. The multiple protruding portions 113 protrude from the other side in the second direction y of the main portion 111. The sealing resin 40 fills the spaces between every two adjacent protruding portions 113. As shown in FIG. 12, the multiple protruding portions 113 each have an auxiliary end surface 113A. The auxiliary end surfaces 113A are connected to both the main surface 101 and the rear surface 102 of the second input terminal 11B, and face the other side in the second direction y. The auxiliary end surface 113A is exposed from the sealing resin 40. As shown in FIG. 7, the multiple auxiliary end surfaces 113A are aligned at a predetermined interval along the first direction x.

Figure 10:
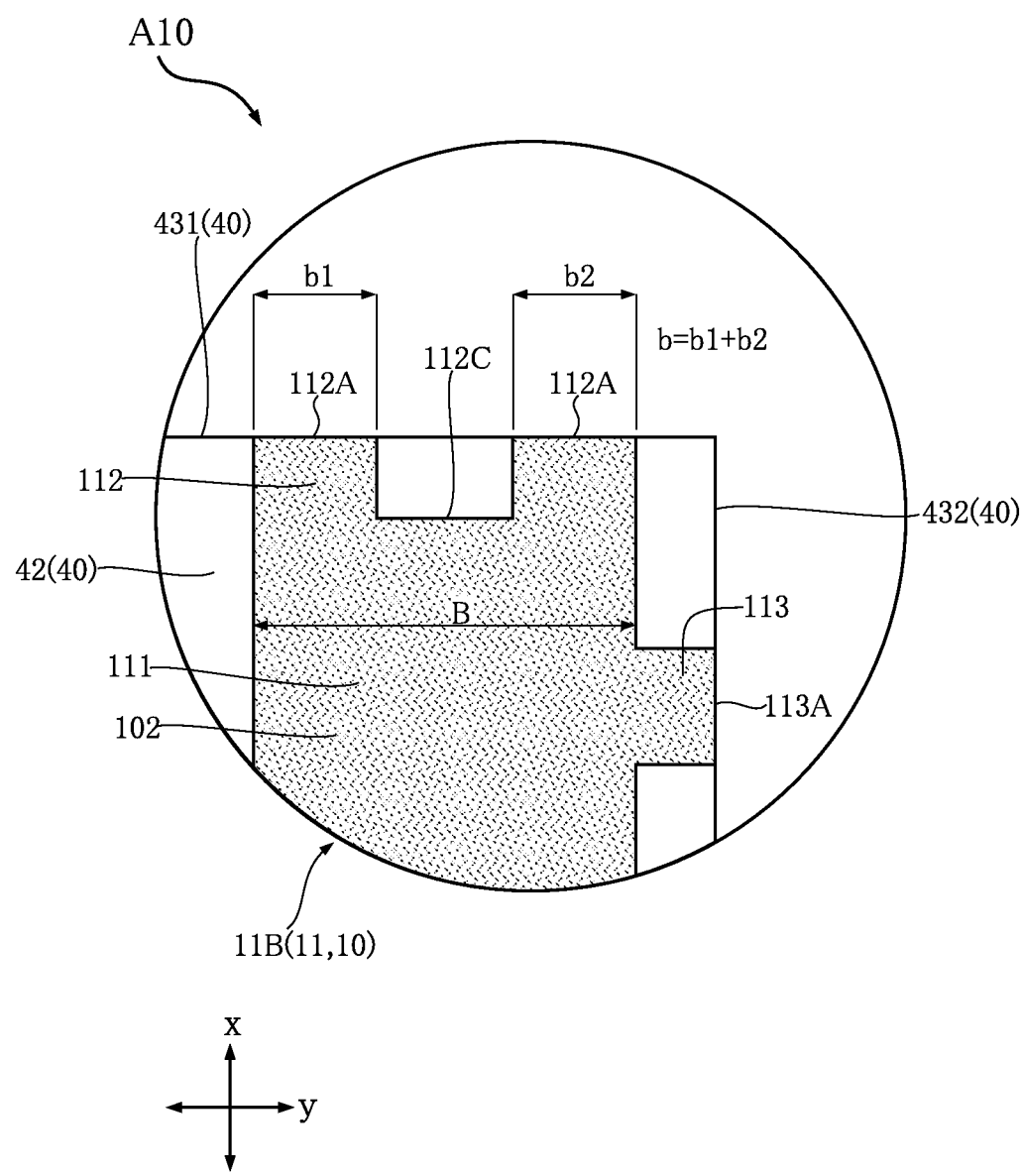
FIG. 10 is a partially enlarged view of FIG. 3.

As shown in FIG. 10, notch portions 112C are formed on the pair of side portions 112 of the second input terminal 11B. The notch portions 112C extend from the main surface 101 to the rear surface 102 of the second input terminal 11B and are recessed in the first direction x from the first end surface 112A. Accordingly, the first end surface 112A is divided into two regions spaced apart from each other in the second direction y. Due to the notch portions 112C as well, the dimension b in the second direction y of each of the pair of first end surfaces 112A is smaller than the dimension B in the second direction y of the rear surface 102 of the main portion 111 in the second input terminal 11B. Note that the dimension b in this context is obtained by adding together a dimension b1 in the second direction y of one region of the first end surface 112A and a dimension b2 in the second direction y of another region of the first end surface 112A (b=b1+b2). The sealing resin 40 fills the notch portions 112C.

As shown in FIGS. 3 and 4, the area of the main surface 101 is greater than the area of rear surface 102 in each of the multiple first leads 11. In the example indicated by the semiconductor device A10, the areas of the rear surfaces 102 of the first input terminal 11A and the output terminal 11C are equal to each other. The area of the rear surface 102 of the second input terminal 11B is greater than the area of each rear surface 102 of the first input terminal 11A and the output terminal 11C.

In each of the first input terminal 11A, the second input terminal 11B, and the output terminal 11C, for example, silver (Ag) plating may be performed on the main surface 101 of the main portion 111 supported by the semiconductor element 20. Furthermore, in each of the first input terminal 11A, the second input terminal 11B, and the output terminal 11C, for example, tin (Sn) plating may be performed on the rear surface 102, the pair of first end surfaces 112A, and the multiple auxiliary end surfaces 113A that are exposed from the sealing resin 40. Note that instead of tin plating, multiple types of metal plating, in which nickel (Ni), palladium (Pd), and gold (Au) are stacked in the stated order, may also be used.

Figure 8:
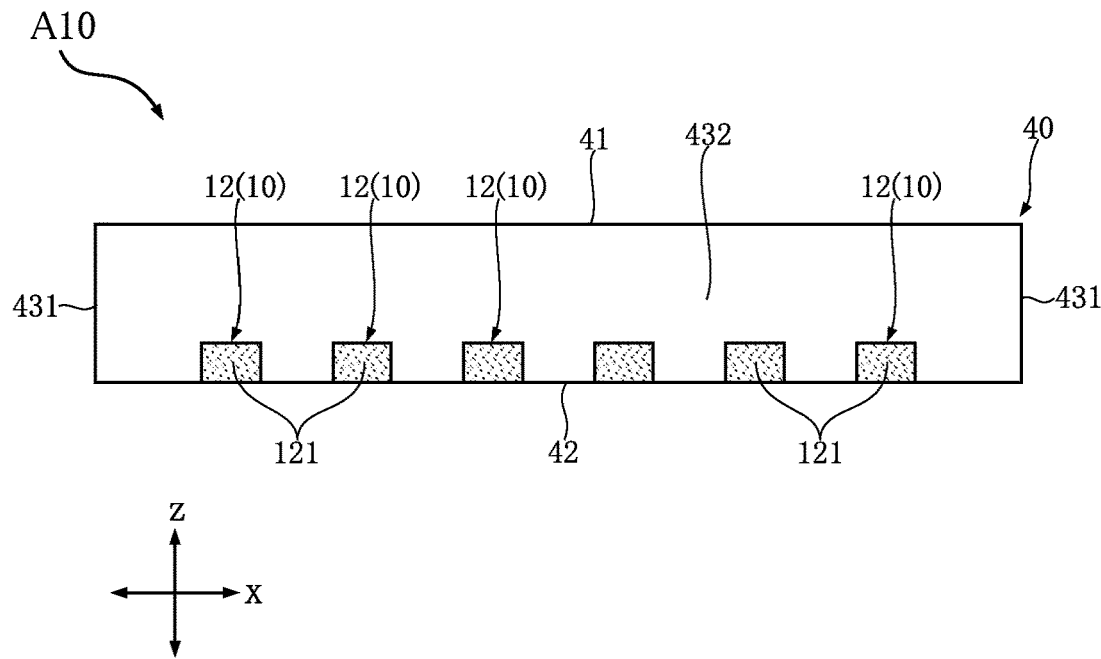
FIG. 8 is a left-side view of the semiconductor device shown in FIG. 1.
Figure 11:
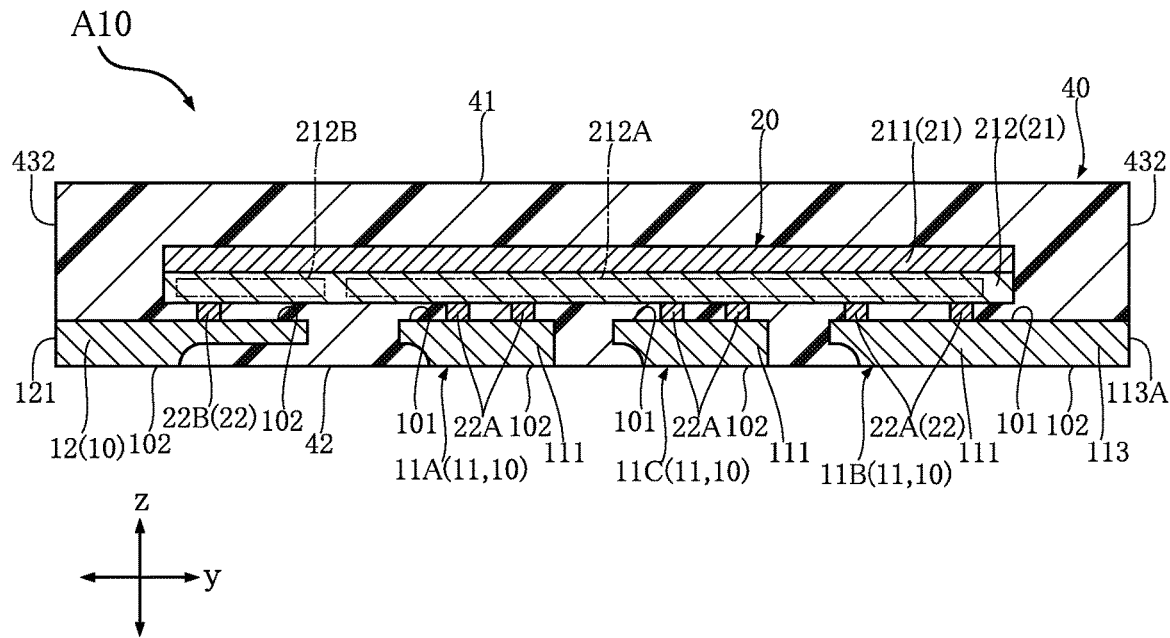
FIG. 11 is a cross-sectional view taken along line XI-XI in FIG. 3.

As shown in FIG. 3, the multiple second leads 12 are located on the one side in the second direction y with respect to the multiple first leads 11. Any one of the multiple second leads 12 is a contact terminal of a control circuit 212B included in the semiconductor element 20. The other multiple second leads 12 receive electrical power (voltage) for driving the control circuit 212B, or an electrical signal for transmitting to the control circuit 212B. As shown in FIGS. 3, 4, and 11, the multiple second leads 12 each have a second end surface 121. The second end surfaces 121 are connected to both the main surfaces 101 and the rear surfaces 102 of the second leads 12 and face the one side in the second direction y. The second end surfaces 121 are exposed from the sealing resin 40. As shown in FIG. 8, the multiple second end surfaces 121 are aligned at a predetermined interval in the first direction x.

As shown in FIGS. 3 and 4, the area of the main surface 101 is greater than the area of rear surface 102 in each of the multiple second leads 12. Note that the areas of the rear surfaces 102 of the multiple second leads 12 are all equal to each other. For example, silver plating may be performed on the rear surfaces 102 of the multiple second leads 12 on which the semiconductor element 20 is supported. Furthermore, for example, tin plating may also be performed on the rear surfaces 102 and the second end surface 121 of the multiple second leads 12 exposed from the sealing resin 40. Note that instead of the plating, for example, multiple types of metal plating in which nickel, palladium, and gold are stacked in the stated order may also be used.

Figure 14:
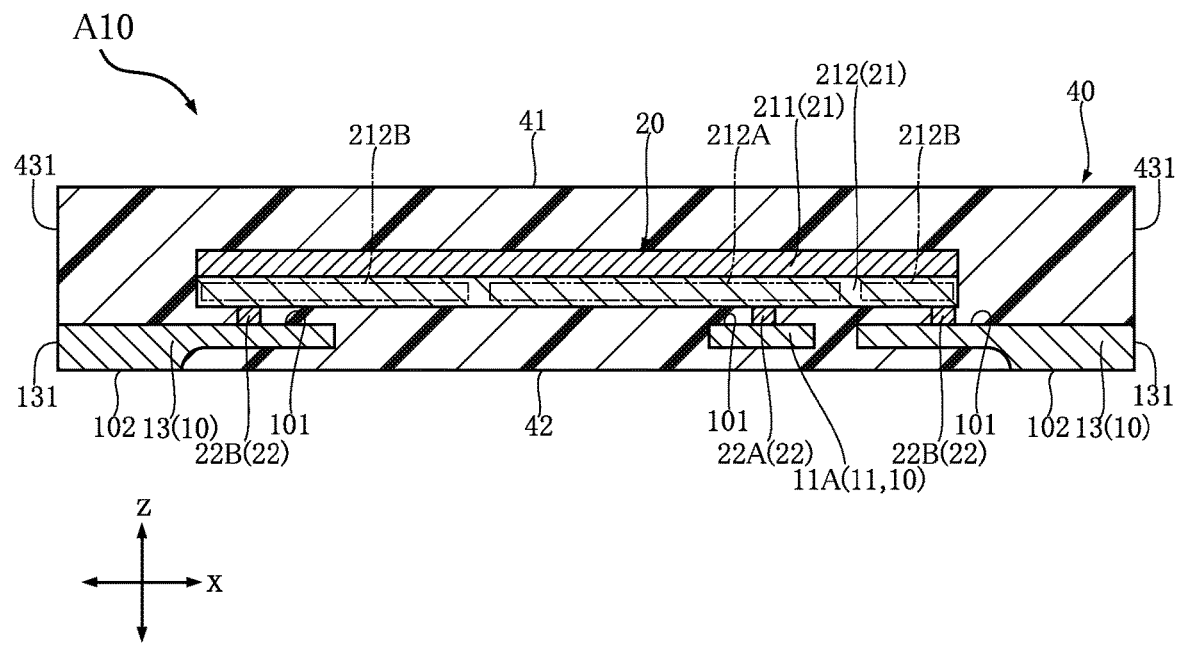
FIG. 14 is a cross-sectional view taken along line XIV-XIV in FIG. 3.

As shown in FIG. 3, the pair of third leads 13 are located between the first leads 11 (first input terminals 11A) and the multiple second leads 12 in the second direction y. The pair of third leads 13 are spaced apart from each other in the first direction x. Each of the pair of third leads 13 receives input of an electrical signal for transmitting to the control circuit 212B included in the semiconductor element 20, and the like. As shown in FIGS. 3, 4, and 14, the pair of third leads 13 each have a third end surface 131. The third end surfaces 131 are connected to both the main surfaces 101 and the rear surfaces 102 and face in the first direction x. The third end surfaces 131 are exposed from the sealing resin 40. The third end surfaces 131 are aligned in the second direction y along with the first end surfaces 112A of the multiple first leads 11.

As shown in FIGS. 3 and 4, the area of the main surface 101 is greater than the area of rear surface 102 in each of the pair of third leads 13. For example, silver plating may also be performed on the main surfaces 101 of the pair of third leads 13 on which the semiconductor element 20 is supported. Furthermore, for example, tin plating may also be performed on the rear surfaces 102 and the third end surfaces 131 of the pair of third leads 13 exposed from the sealing resin 40. Note that instead of tin plating, for example, multiple types of metal plating in which nickel, palladium, and gold are stacked in the stated order may also be used.

As shown in FIGS. 11 to 14, the semiconductor element 20 is electrically bonded to and supported by the conductive member 10 (the multiple first leads 11, the multiple second leads 12, and the pair of third leads 13) through flip-chip bonding. The semiconductor element 20 is covered by the sealing resin 40. As shown in FIGS. 12 to 18, the semiconductor element 20 includes an element main body 21, multiple electrodes 22, and an outer surface protection film 23.

Figure 15:
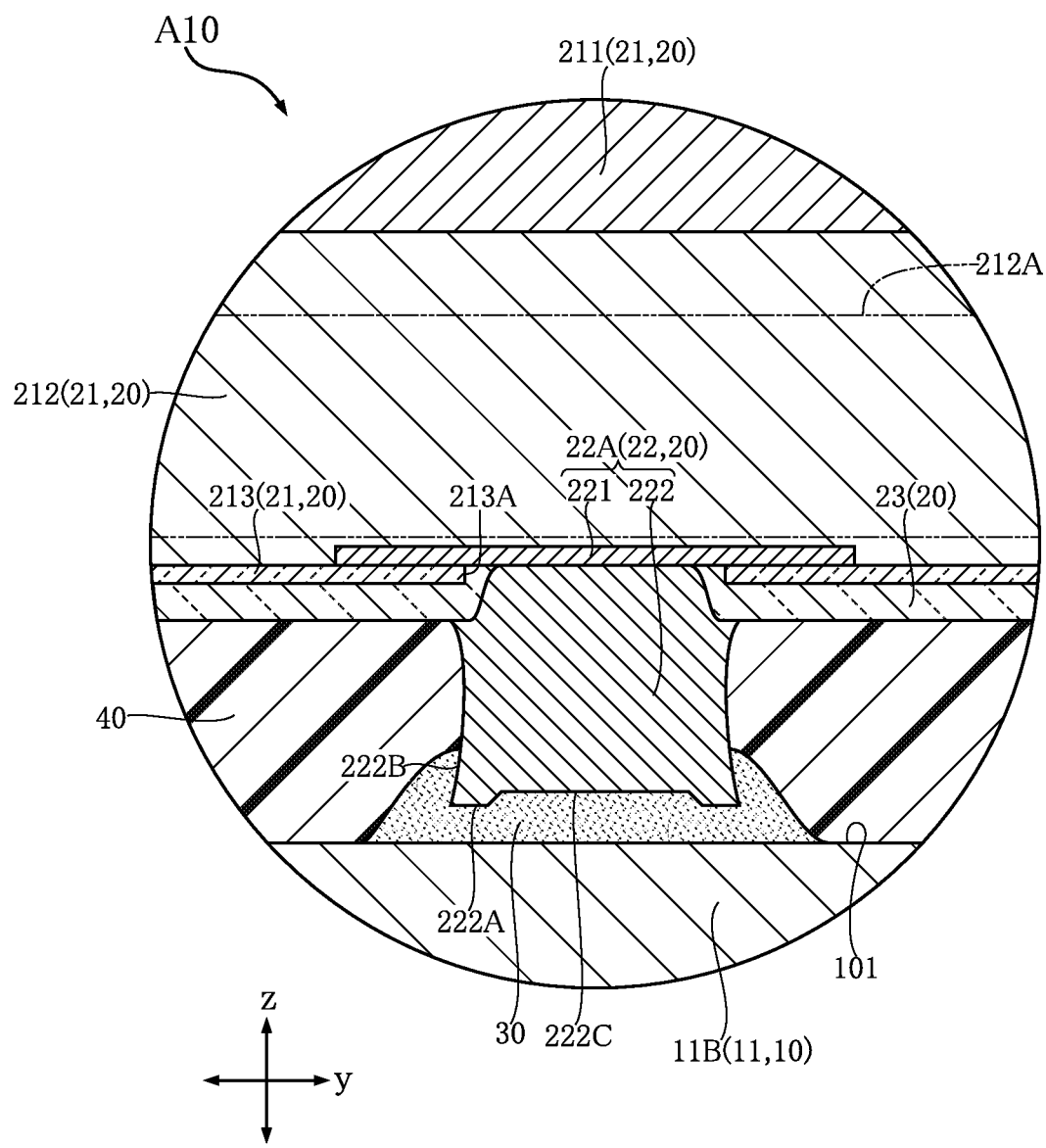
FIG. 15 is a partially enlarged view of FIG. 11 (near a first electrode).
Figure 16:
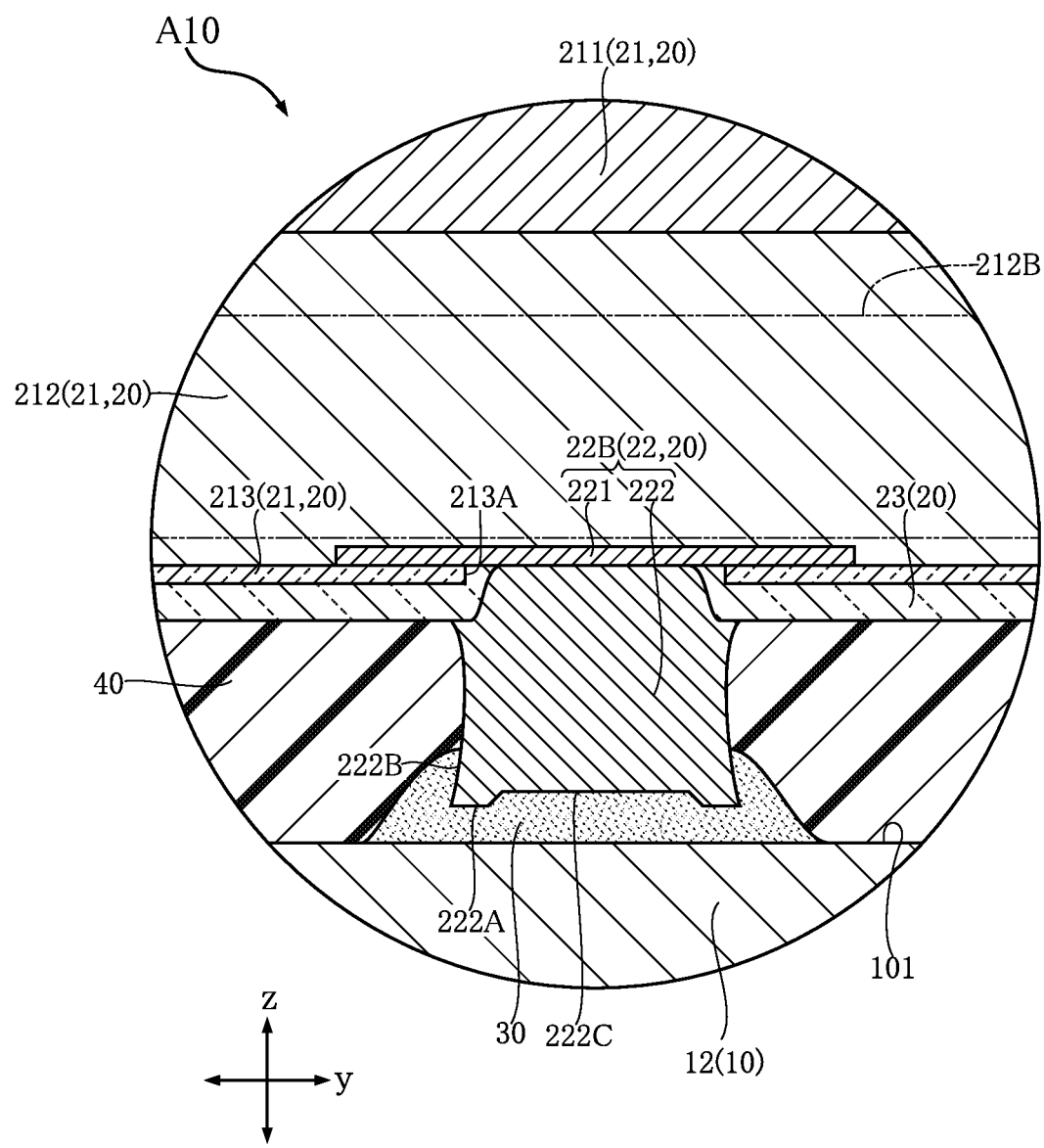
FIG. 16 is a partially enlarged view of FIG. 11 (near a second electrode).

The element main body 21 forms the main portion of the semiconductor element 20. As shown in FIGS. 15 and 16, the element main body 21 includes a semiconductor substrate 211, a semiconductor layer 212, and a passivation film 213.

As shown in FIGS. 15 and 16, the semiconductor substrate 211 supports the semiconductor layer 212, the passivation film 213, the multiple electrodes 22, and the outer surface protection film 23 on its lower side. The constituent material of the semiconductor substrate 211 is, for example, Si (silicon) or silicon carbide (SiC).

As shown in FIGS. 11 to 14, the semiconductor layer 212 is stacked on the side of the semiconductor substrate 211 that opposes the main surfaces 101 of the conductive members 10. The semiconductor layer 212 includes multiple types of p-type semiconductors and n-type semiconductors based on differences in the amount of doped elements. A switching circuit 212A and a control circuit 212B that is electrically connected to the switching circuit 212A are included in the semiconductor layer 212. The switching circuit 212A is a MOSFET (Metal-Oxide-Semiconductor Field-Effect Transistor), an IGBT (Insulated Gate Bipolar Transistor), or the like. In the example indicated by the semiconductor device A10, the switching circuit 212A is divided into two regions, namely a high-voltage region (upper arm circuit) and a low-voltage region (lower arm circuit). The regions are each constituted by one n-channel MOSFET. The control circuit 212B includes a gate driver for driving the switching circuit 212A, a bootstrap circuit corresponding to the high-voltage region of the switching circuit 212A, and the like, and performs control for normally running the switching circuit 212A. Note that a wiring layer (not shown) is included in the semiconductor layer 212. The switching circuit 212A and the control circuit 212B are electrically connected to each other due to the wiring layer.

As shown in FIGS. 15 and 16, the passivation film 213 covers the lower surface of the semiconductor layer 212. The passivation film 213 has an electrically insulating property. For example, the passivation film 213 is constituted by a silicon oxide film ($SiO_2$) that is in contact with the lower surface of the semiconductor layer 212, and a silicon nitride film ($Si_3N_4$) that is stacked on the silicon oxide film. The passivation film 213 is provided with multiple openings 213A that penetrate in the thickness direction z.

As shown in FIGS. 11 to 14, the multiple electrodes 22 protrude from the side of the element main body 21 opposing the main surfaces 101 of the conductive members 10, toward the main surfaces 101 of the conductive members 10. Note that the upper ends of the multiple electrodes 22 are in contact with the semiconductor layer 212 of the element main body 21. The multiple electrodes 22 are electrically bonded to the main surfaces 101 of the conductive members 10. The multiple electrodes 22 include multiple first electrodes 22A and multiple second electrodes 22B. The multiple first electrodes 22A are electrically connected to the switching circuit 212A of the semiconductor layer 212. In addition, the multiple first electrodes 22A are electrically bonded to the main surfaces 101 of the multiple first leads 11. Accordingly, the multiple first leads 11 are electrically connected to the switching circuit 212A. Also, the multiple second electrodes 22B are electrically connected to the control circuit 212B of the semiconductor layer 212. In addition, a majority of the multiple second electrodes 22B are electrically bonded to the main surfaces 101 of the multiple second leads 12. In addition, the rest of the multiple second electrodes 22B are electrically bonded to the main surfaces 101 of the pair of third leads 13. Accordingly, the multiple second leads 12 and the pair of third leads 13 are electrically connected to the control circuit 212B.

As shown in FIGS. 15 and 16, the multiple electrodes 22 each include a base portion 221 and a columnar portion 222. Note that base portion 221 is in contact with the semiconductor layer 212 of the element main body 21. Accordingly, the base portion 221 is electrically connected to one of the switching circuit 212A and the control circuit 212B of the semiconductor layer 212. The constituent material of the base portion 221 includes aluminum (Al) or copper. In another configuration of the base portion 221, multiple types of metal layers may also be used, in which copper, nickel, and palladium are stacked in the stated order downward from the semiconductor layer 212. The base portion 221 is in contact with the passivation film 213 of the element main body 21. A portion of the base portion 221 is exposed from the opening 213A of the passivation film 213. The columnar portion 222 protrudes toward the main surface 101 of the conductive member 10 from the portion of the base portion 221 exposed from the opening 213A. The columnar portion 222 has a circular column shape, for example. The constituent material of the columnar portion 222 includes copper. The columnar portion 222 includes a leading end surface 222A and a side surface 222B. The leading end surface 222A opposes the main surface 101 of the conductive member 10. The side surface 222B is connected to the leading end surface 222A and faces the direction orthogonal to the thickness direction z. In the semiconductor device A10, a recessed portion 222C that is recessed from the leading end surface 222A to the element main body 21 is formed in the columnar portion 222. Note that the multiple electrodes 22 are formed through electroplating.

As shown in FIGS. 15 and 16, the outer surface protection film 23 covers the side of the element main body that opposes the main surfaces 101 of the conductive members 10, that is, the passivation film 213 of the element main body 21. In each of the multiple electrodes 22, the leading end surface 222A of the columnar portion 222 is located between the main surface 101 of the conductive member 10 and the outer surface protection film 23 in the thickness direction z. In the semiconductor apparatus A10, the outer surface protection film 23 is in contact with both the base portion 221 and the columnar portion 222 of the multiple electrodes 22. The outer surface protection film 23 has an electrically insulating property. The constituent material of the outer surface protection layer 23 is, for example, polyamide.

As shown in FIGS. 15 and 16, the bonding layer 30 is in contact with both the main surfaces 101 of the conductive members 10 and the multiple electrodes 22. The bonding layer 30 is conductive. Accordingly, the multiple electrodes 22 are electrically bonded to the main surfaces 101 of the conductive members 10. The bonding layer 30 is a sintered body in which metal powder is bonded together. The metal powder includes silver or copper. The metal powder becomes a sintered body under a temperature condition of 200° C. to 300° C. According to this temperature condition, a lead-free solder will melt. For this reason, the bonding layer 30, which is a sintered body, can be formed under a temperature condition similar to that in the case of melting a lead-free solder. In each of the multiple electrodes 22, the bonding layer 30 is in contact with both the leading end surface 222A and the side surface 222B of the columnar portion 222. In the semiconductor device A10, the bonding layer 30 is also in contact with the recessed portion 222C of the columnar portion 222.

As shown in FIGS. 5 to 8, the sealing resin 40 includes a peak surface 41, a bottom surface 42, a pair of first side surfaces 431, and a pair of second side surfaces 432. The constituent material of the sealing resin 40 is, for example, black epoxy resin.

As shown in FIGS. 11 to 14, the peak surface 41 faces the same side as the main surfaces 101 of the conductive members 10 in the thickness direction z. As shown in FIGS. 5 to 8, the bottom surface 42 faces the side opposite to the peak surface 41. As shown in FIG. 4, the rear surfaces 102 of the multiple first leads 11, the rear surfaces 102 of the second leads 12, and the rear surfaces 102 of the pair of third leads 13 are exposed from the bottom surface 42.

Figure 13:
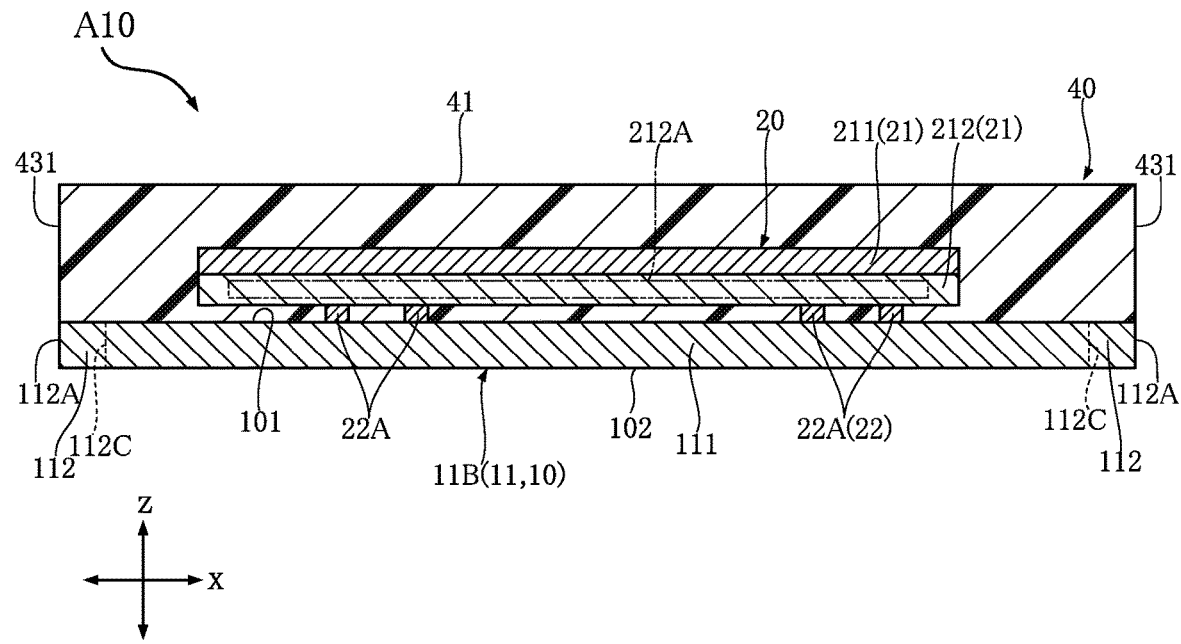
FIG. 13 is a cross-sectional view taken along line XIII-XIII in FIG. 3.

As shown in FIGS. 7 and 8, the pair of first side surfaces 431 are connected to both the peak surface 41 and the bottom surface 42 and face in the first direction x. The pair of first side surfaces 431 are spaced apart from each other in the second direction y. As shown in FIGS. 12 to 14, the first end surfaces 112A of the multiple first leads 11 and the third end surfaces 131 of the third leads 13 are exposed from the pair of first side surfaces 431 so as to be flush with each other.

Figure 5:
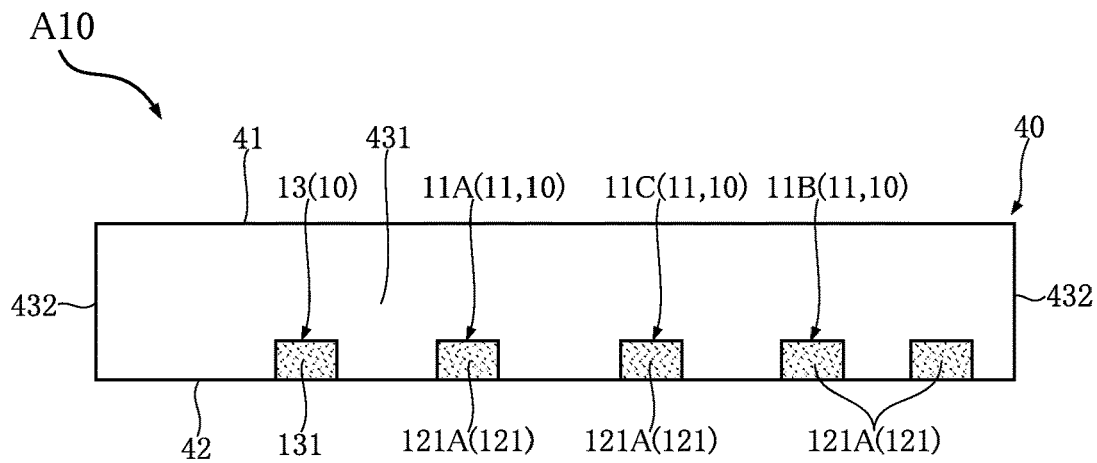
FIG. 5 is a front view of the semiconductor device shown in FIG. 1.
Figure 5:
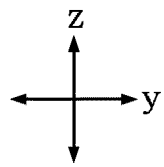
Figure 6:
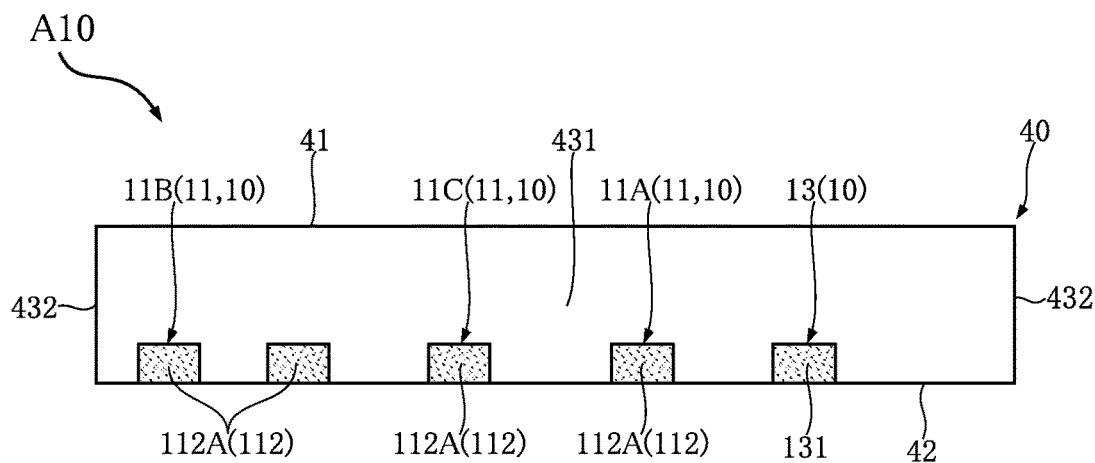
FIG. 6 is a rear view of the semiconductor device shown in FIG. 1.
Figure 6:
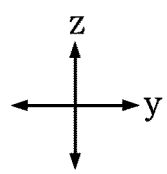

As shown in FIGS. 5 and 6, the pair of second side surfaces 432 are connected to the peak surface 41, the bottom surface 42, and the pair of first side surfaces 431, and face in the second direction y. The pair of second side surfaces 432 are spaced apart from each other in the first direction x. As shown in FIG. 11, the second end surfaces 121 of the multiple second leads 12 are exposed from the second side surface 432 located on the one side in the second direction y so as to be flush with the second side surface 432. The multiple auxiliary end surfaces 113A of the second input terminals 11B (first leads 11) are exposed from the second side surface 432 located on the other side in the second direction y so as to be flush with the second side surface 432.

Next, actions and effects of the semiconductor device A10 will be described.

The semiconductor device A10 includes: conductive members 10 having main surfaces 101; a semiconductor element 20 having an element main body 21 and multiple electrodes 22 that are electrically bonded to the main surfaces 101; and a bonding layer 30 that is in contact with both the main surfaces 101 and the multiple electrodes 22. The multiple electrodes 22 each have a base portion 221 that is in contact with the side of the element main body 21 opposing the main surface 101, and a columnar portion 222 that protrudes from the base portion 221 to the main surfaces 101 and is in contact with the bonding layer 30. Accordingly, the semiconductor element 20 is electrically bonded to the conductive member 10 through flip-chip bonding. The bonding layer 30 is a sintered body in which metal powder is bonded together. The melting point of the sintered body can be set to about 1000° C. (if the metal powder is silver or copper), which is close to five times the melting point of solder. Accordingly, with the semiconductor device A10, it is possible to suppress the occurrence of electromigration in the bonding layer 30 used in flip-chip bonding.

The columnar portions 222 of the electrodes 22 of the semiconductor element 20 each include a leading end surface 222A that opposes the main surface 101 of the conductive member 10, and a side surface 222B. The bonding layer 30 is in contact with both the leading end surface 222A and the side surface 222B. Accordingly, since the contact area of the bonding portion 30 on the columnar portion 222 increases, the current density in the bonding layer 30 can be reduced. Accordingly, it is possible to further suppress the occurrence of electromigration in the bonding layer 30.

In the semiconductor device A10, the columnar portions 222 of the electrodes 22 of the semiconductor element 20 are each provided with a recessed portion 222C that is recessed from the leading end surface 222A to the element main body 21. The recessed portions 222C are in contact with the bonding layer 30. Accordingly, an anchoring effect on the columnar portion 222 occurs in the bonding layer 30. For this reason, it is possible to achieve an improvement in the bond strength between the columnar portions 222 and the bonding layer 30.

The semiconductor layer 212 of the element main body 21 of the semiconductor element 20 includes the switching circuit 212A. The multiple first electrodes 22A included in the multiple electrodes 22 are electrically connected to the switching circuit 212A. On the other hand, the rear surfaces 102 of the multiple first leads 11 that are included in the conductive members 10 and to which the multiple first electrodes 22A are electrically bonded are exposed from the bottom surface 42 of the sealing resin 40. Accordingly, when the semiconductor device A10 is used, the heat generated from the semiconductor element 20 due to the driving of the switching circuit 212A can be efficiently dissipated to the outside.

As stated before, each of the multiple first electrodes 22A includes a base portion 221 and a columnar portion 222. The constituent material of the columnar portion 222 includes copper. The columnar portion 222 has a shorter length and a greater cross-sectional area than a bonding wire. For this reason, it is possible to reduce parasitic resistance between the first leads 11 and the switching circuit 212A compared to a case in which the first leads 11 and the base portion 221 are connected by bonding wires. If the parasitic resistance is reduced, an effect of reducing the on resistance and noise of the switching circuit 212A is obtained.

Each of the multiple first leads 11 includes a main portion 111 that extends in the first direction x, and a pair of side portions 112 that are connected to the two ends in the first direction x of the main portion 111. The pair of side portions 112 each include a first end surface 112A that faces the first direction x and is exposed from the first side surface 431 of the sealing resin 40. The pair of first end surfaces 112A are flush with the first side surface 431. In the second direction y, the dimensions b of the pair of first side surfaces 112A are smaller than the dimensions B of the rear surfaces 102 of the main portions 111. Accordingly, the areas of the pair of first end portions 112A can be made smaller than the areas of the first end surfaces in a conventional QFN semiconductor device. For this reason, blade dicing is performed in the manufacture of the semiconductor device A10, the occurrence of metal burrs on the pair of first end surfaces 112A is suppressed. If the occurrence of metal burrs is suppressed, it is possible to achieve an improvement in the mountability of the semiconductor apparatus A10 on the wiring substrate.

As shown in FIG. 9, wedge portions 112B is formed on each of the pair of side portions 112 of the multiple first leads 11 (the first input terminal 11A and the output terminal 11C). Accordingly, the dimensions b of the pair of first end surfaces 112A can be made smaller in the second direction y than the dimensions B of the rear surfaces 102 of the main portions 111 of the first leads 11. Also, the wedge portions 112B are in contact with the sealing resin 40 in the first direction x. Accordingly, it is possible to prevent the multiple first leads 11 from coming out from the pair of first side surfaces 431 of the sealing resin 40.

As shown in FIG. 10, the notch portions 112C are formed in the pairs of side portions 112 of the first leads 11 (second input terminal 11B). Accordingly, the dimensions b of the pair of first end surfaces 112A can be made smaller in the second direction y than the dimensions B of the rear surfaces 102 of the main portions 111 of the first leads 11. The sealing resin 40 fills the notch portions 112C. Accordingly, the first leads 11 are in contact with the sealing resin 40 in the first direction x. Accordingly, it is possible to prevent the multiple first leads 11 from coming out from the pair of first side surfaces 431 of the sealing resin 40.

The second input terminals 11B include multiple protruding portions 113 that protrude from the other side in the second direction y of the main portions 111. The multiple protruding portions 113 each have an auxiliary end surface 113A that faces the second direction y. The multiple auxiliary end surfaces 113A are exposed from the second side surface 432 of the sealing resin 40 located on the other side in the second direction y. Accordingly, the second input terminal 11B is in contact with the sealing resin 40 on the other side in the second direction y. Thus, it is possible to prevent the second input terminal 11B from coming out from the second side surface 432 located on the other side in the second direction y.

In each of the multiple first leads 11, the area of the main surface 101 is greater than the area of the rear surface 102. Accordingly, the multiple first leads 11 are in contact with the sealing resin 40 on the side that the rear surface 102 faces in the thickness direction z. Accordingly, it is possible to prevent the multiple first leads 11 from coming out from the bottom surface 42 of the sealing resin 40. Also, it is possible to increase the areas of the main surfaces 101 of the multiple first leads to which the multiple first electrodes 22A of the semiconductor element 20 are electrically bonded. This makes it possible to achieve an increase in the number of the multiple first electrodes 22A.

The conductive members 10 further include multiple second leads 12 to which at least some of the multiple second electrodes 22B included in the multiple electrodes 22 are electrically bonded. In each of the multiple second leads 12, the area of the main surface 101 is greater than the area of the rear surface 102. Accordingly, similarly to the relationship between the main surfaces 101 and the rear surfaces 102 of the above-described first leads 11, it is possible to prevent the multiple second leads 12 from coming out from the bottom surface 42 of the sealing resin 40. Also, since it is possible to further increase the areas of the main surfaces 101 of the multiple second leads 12 to which the multiple second electrodes 22B are electrically bonded, it is possible to achieve an increase in the number of the multiple second electrodes 22B.

Figure 17:
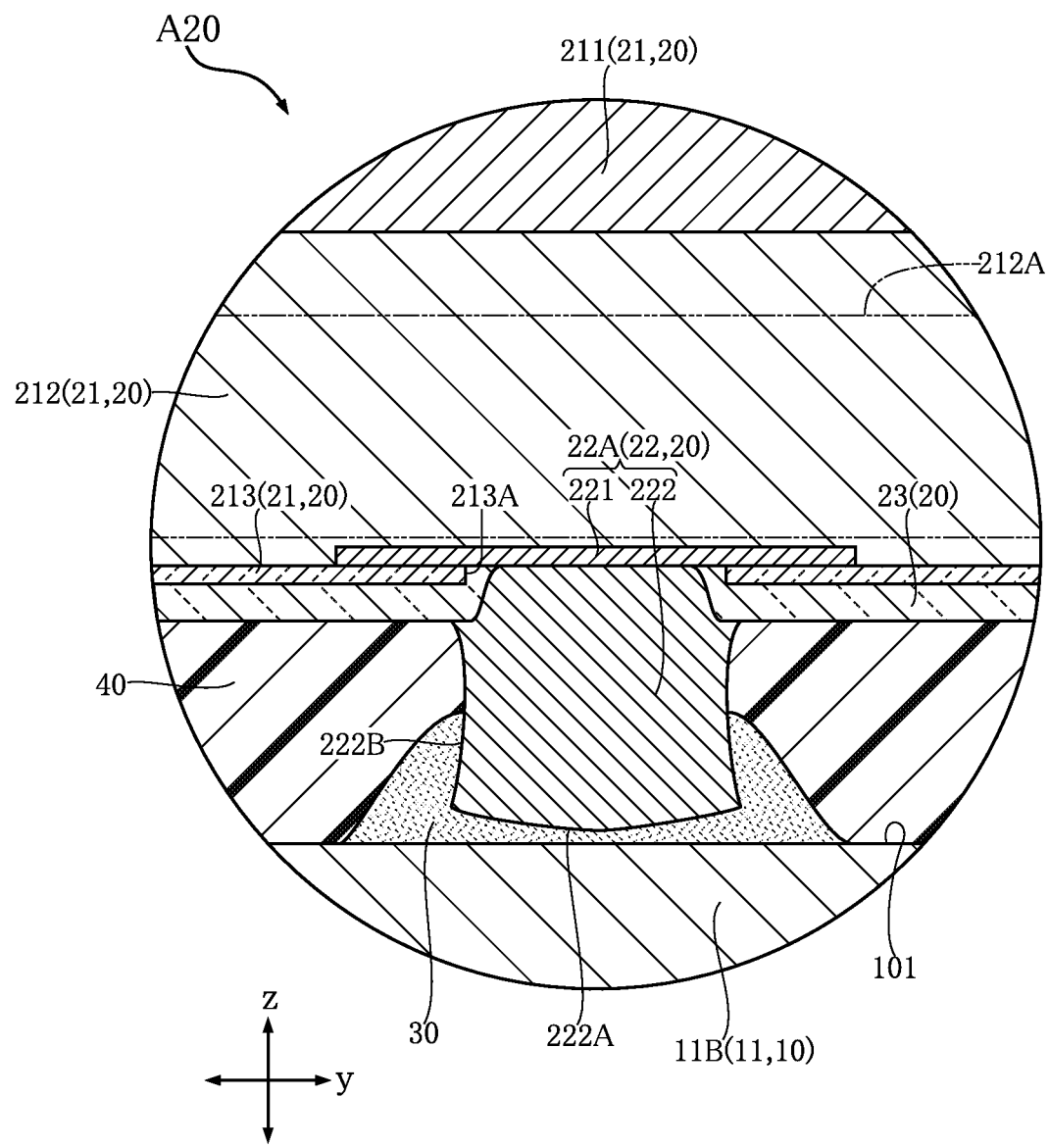
FIG. 17 is a partially enlarged cross-sectional view of a semiconductor device according to a second embodiment (near a first electrode).

A semiconductor device A20 according to a second embodiment will be described with reference to FIGS. 17 and 18. In these drawings, elements that are the same as or similar to those of the above-described semiconductor device A10 will be denoted by the same reference numerals, and redundant description will be omitted. Here, the cross-section position of FIG. 17 is the same as the cross-section position of FIG. 15. The cross-section position of FIG. 18 is the same as the cross-section position of FIG. 16.

In the semiconductor device A20, the configuration of the multiple electrodes 22 of the semiconductor element 20 is different from the configuration of the above-described semiconductor device A10.

Figure 18:
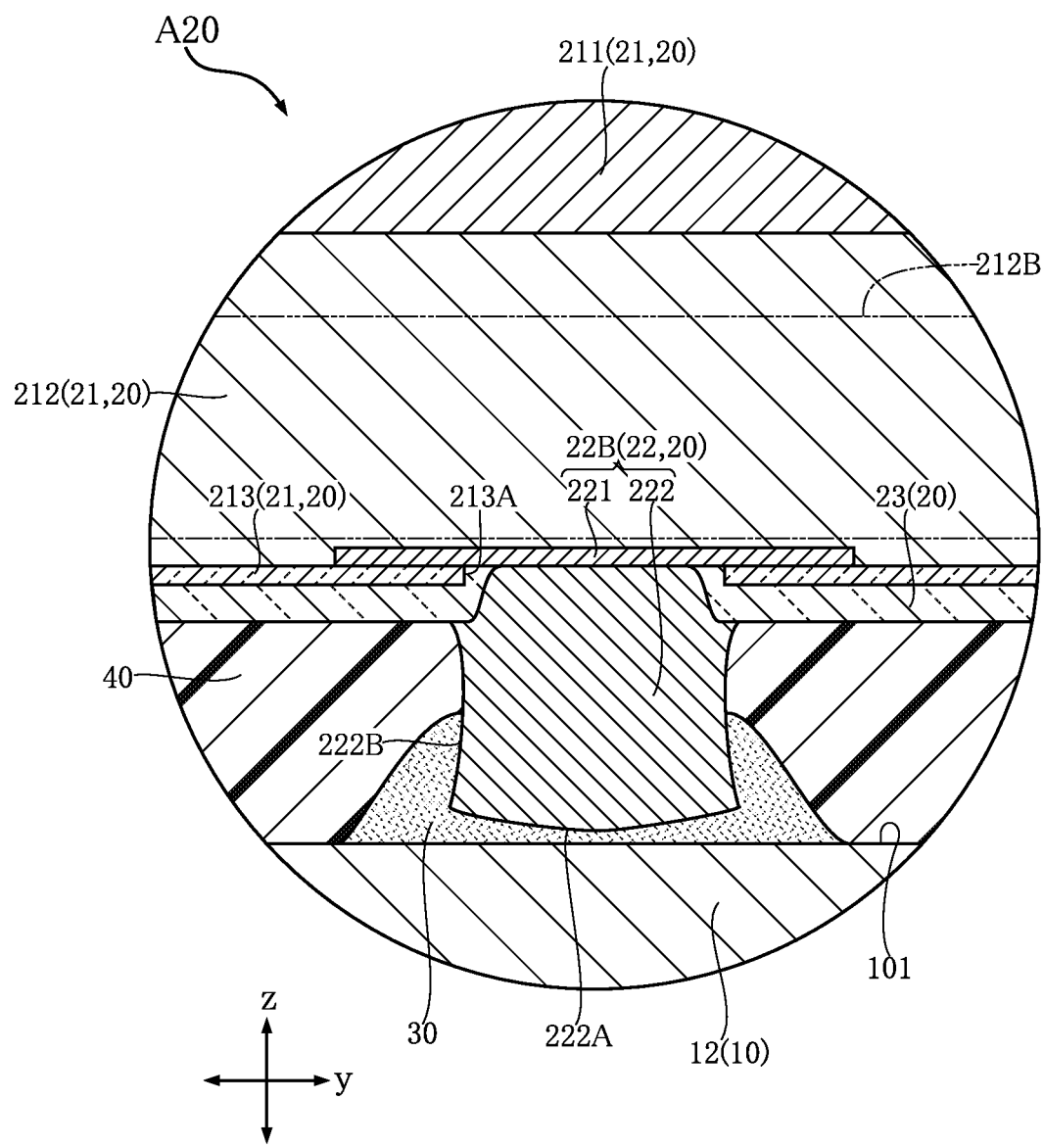
FIG. 18 is a partially enlarged cross-sectional view of the semiconductor device shown in FIG. 17 (near a second electrode).

As shown in FIGS. 17 and 18, in each of the multiple electrodes 22 (the multiple first electrodes 22A and the multiple second electrodes 22B), the leading end surface 222A of the columnar portion 222 has a protruding shape that bulges toward the main surface 101 of the conductive member 10.

Next, actions and effects of the semiconductor device A20 will be described.

The semiconductor device A20 includes: conductive members 10 having main surfaces 101; a semiconductor element 20 having an element main body 21 and multiple electrodes 22 that are electrically bonded to the main surfaces 101; and a bonding layer 30 that is in contact with both the main surfaces 101 and the multiple electrodes 22. The multiple electrodes 22 each have a base portion 221 that is in contact with the side of the element main body 21 opposing the main surface 101, and a columnar portion 222 that protrudes from the base portion 221 to the main surfaces 101 and is in contact with the bonding layer 30. The bonding layer 30 is a sintered body in which metal powder is bonded together. Accordingly, with the semiconductor device A20 as well, it is possible to suppress the occurrence of electromigration in the bonding layer 30 used in flip-chip bonding.

With the semiconductor apparatus A20, the leading end surfaces 222A of the columnar portions 222 have protruding shapes that bulge toward the main surfaces 101 of the conductive members 10 in the multiple electrodes 22. Accordingly, when the semiconductor element 20 is electrically bonded to the conductive members 10 through flip-chip bonding, the bonding layer 30 that is interposed between the main surfaces 101 and the columnar portions 222 is spread out in a direction orthogonal to the thickness direction z. The spread-out bonding layer 30 is in contact with the side surfaces 222B of the columnar portions 222. For this reason, the contact area of the bonding layer 30 on the side surface 222B further increases, and therefore it is possible to reduce the current density of the bonding layer 30. Accordingly, the occurrence of electromigration in the bonding layer 30 can be suppressed further than with the above-described semiconductor device A10.

Figure 19:
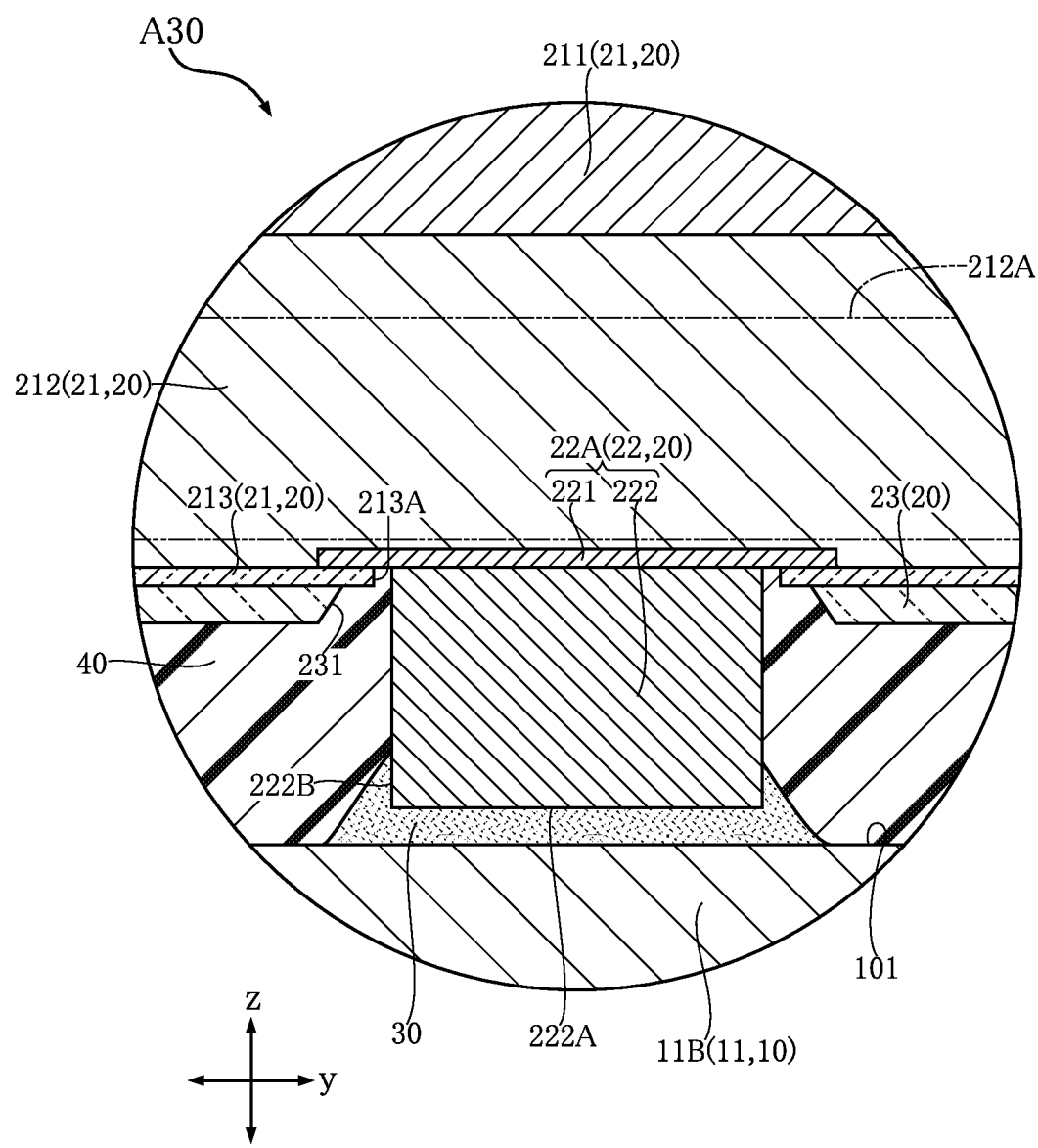
FIG. 19 is a partially enlarged cross-sectional view of a semiconductor device according to a third embodiment (near a first electrode).

A semiconductor device A30 according to a third embodiment will be described with reference to FIGS. 19 and 20. In these drawings, elements that are the same as or similar to those of the above-described semiconductor device A10 will be denoted by the same reference numerals, and redundant description will be omitted. Here, the cross-section position of FIG. 19 is the same as the cross-section position of FIG. 15. The cross-section position of FIG. 20 is the same as the cross-section position of FIG. 16.

In the semiconductor device A30, the configurations of the multiple electrodes 22 and the outer surface protection film 23 of the semiconductor element 20 are different from those in the above-described semiconductor apparatus A10.

Figure 20:
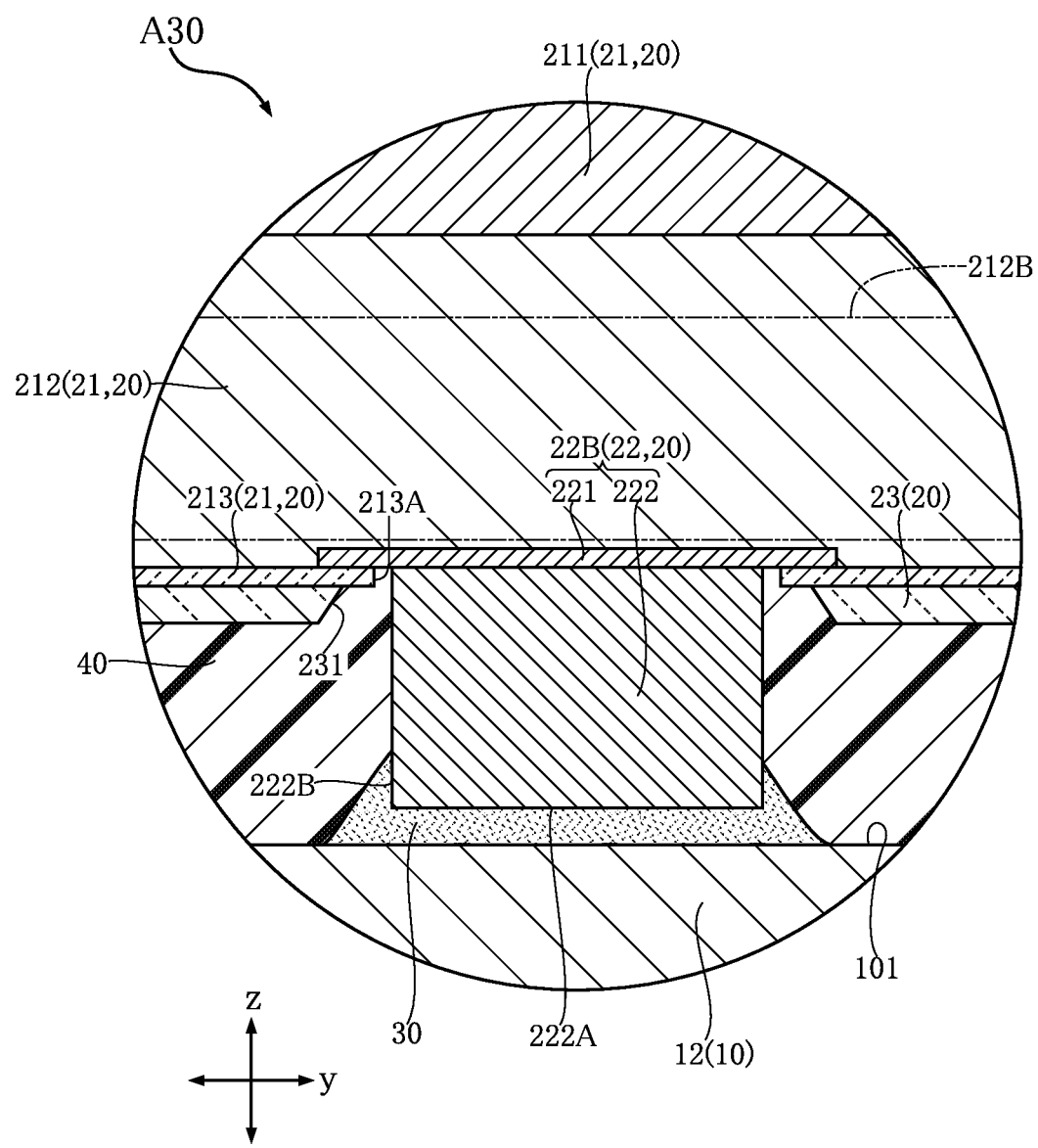
FIG. 20 is a partially enlarged cross-sectional view of the semiconductor device shown in FIG. 19 (near a second electrode).

As shown in FIGS. 19 and 20, in each of the multiple electrodes 22 (the multiple first electrodes 22A and the multiple second electrodes 22B), the leading end surface 222A of the columnar portion 222 is parallel to the main surface 101 of the conductive member 10.

As shown in FIGS. 19 and 20, the outer surface protection film 23 is spaced apart from the columnar portions 222 of the multiple electrodes 22. The outer surface protection film 23 is provided with multiple openings 231 that penetrate in the thickness direction z. The columnar portions 222 of the first electrodes 22A and the second electrodes 22B are exposed from the multiple openings 231. Accordingly, when forming the multiple electrodes 22, the volumes of the columnar portions 222 can be made larger than the volumes of the columnar portions 222 of the above-described semiconductor apparatus A10 and semiconductor apparatus A20.

Next, actions and effects of the semiconductor device A30 will be described.

The semiconductor device A30 includes: conductive members 10 having main surfaces 101; a semiconductor element 20 having an element main body 21 and multiple electrodes 22 that are electrically bonded to the main surfaces 101; and a bonding layer 30 that is in contact with both the main surfaces 101 and the multiple electrodes 22. The multiple electrodes 22 each have a base portion 221 that is in contact with the side of the element main body 21 opposing the main surface 101, and a columnar portion 222 that protrudes from the base portion 221 to the main surfaces 101 and is in contact with the bonding layer 30. The bonding layer 30 is a sintered body in which a metal powder is bonded together. Accordingly, with the semiconductor device A30 as well, it is possible to suppress the occurrence of electromigration in the bonding layer 30 used in flip-chip bonding.

In the semiconductor device A30, the outer surface protection film 23 of the semiconductor element 20 is spaced apart from the columnar portions 222 of the multiple electrodes 22. Accordingly, the volumes of the columnar portions 222 can be made greater than the volumes of the columnar portions 222 of the above-described semiconductor device A10 and semiconductor device A20. For this reason, the contact area of the bonding layer 30 on the columnar portion 222 further increases, and therefore it is possible to reduce the current density of the bonding layer 30. Accordingly, the occurrence of electromigration in the bonding layer 30 can be suppressed further than with the above-described semiconductor device A10.

In the examples indicated by the semiconductor device A10, the semiconductor device A20, and the semiconductor device A30, the conductive members 10 are the multiple leads (the multiple first leads 11, the multiple second leads 12, and the pair of third leads 13) that are formed by the same lead frame. In another configuration of the conductive member 10, it is also possible to include an insulating substrate, and a conductive layer including multiple regions that are arranged on the insulating substrate and are spaced apart from each other.

The present disclosure is not limited to the above-described embodiments. Specific configurations of the units of the present disclosure can be designed and modified in various ways.

The invention claimed is:

1. A semiconductor device comprising:
   an electric conductor having a main surface and a rear surface that face mutually opposite sides in a thickness direction;
   a semiconductor element including an element main body and a plurality of electrodes, the element main body having a first side facing the main surface of the electric conductor, the plurality of electrodes each protruding toward the main surface from the first side of the element main body and being electrically connected to the main surface;
   a sealing resin that covers at least a part of the electric conductor and at least a part of the semiconductor element, the rear surface of the electric conductor being exposed from the sealing resin; and
   a bonding layer held in contact with the main surface and the plurality of electrodes,
   wherein each of the plurality of electrodes includes: a base portion in contact with the element main body; and a columnar portion protruding toward the main surface from the base portion and held in contact with the bonding layer,
   the bonding layer is a sintered body of a metal powder,
   the columnar portion of each electrode includes a leading end surface facing the main surface, the bonding layer being in contact with the leading end surface,
   the semiconductor element includes an outer surface protection film that covers the first side of the element main body, and
   the leading end surface of each electrode is located between the main surface and the outer surface protection film in the thickness direction.

2. The semiconductor device according to claim 1, wherein
   the columnar portion of each electrode includes a side surface connected to the leading end surface and facing in a direction orthogonal to the thickness direction, and
   the bonding layer is in contact with the side surface.

3. The semiconductor device according to claim 1, wherein the outer surface protection film is in contact with the base portion and the columnar portion of each electrode.

4. The semiconductor device according to claim 1, wherein the outer surface protection film is spaced apart from the columnar portion of each electrode.

5. A semiconductor device comprising:
   an electric conductor having a main surface and a rear surface that face mutually opposite sides in a thickness direction;
   a semiconductor element including an element main body and a plurality of electrodes, the element main body having a first side facing the main surface of the electric conductor, the plurality of electrodes each protruding toward the main surface from the first side of the element main body and being electrically connected to the main surface; and a bonding layer held in contact with the main surface and the plurality of electrodes, wherein each of the plurality of electrodes includes: a base portion in contact with the element main body; and a columnar portion protruding toward the main surface from the base portion and held in contact with the bonding layer, the bonding layer is a sintered body of a metal powder, the columnar portion of each electrode includes a leading end surface facing the main surface and a side surface connected to the leading end surface and facing in a direction orthogonal to the thickness direction, the bonding layer is in contact with the leading end surface and the side surface, the semiconductor element includes an outer surface protection film that covers the first side of the element main body, the leading end surface of each electrode is located between the main surface and the outer surface protection film in the thickness direction, the outer surface protection film is in contact with the base portion and the columnar portion of each electrode, the columnar portion of each electrode is provided with a recessed portion that is recessed toward the element main body from the leading end surface, and the bonding layer is in contact with the recessed portion.

6. The semiconductor device according to claim 5, wherein the leading end surface of each electrode has a protruding shape that bulges toward the main surface.

7. The semiconductor device according to claim 5, wherein the base portion of each electrode is made of a material including aluminum.

8. The semiconductor device according to claim 5, wherein the base portion of each electrode is made of a material including copper.

9. The semiconductor device according to claim 5, wherein the metal powder includes silver.

10. The semiconductor device according to claim 5, wherein the metal powder includes copper.

11. A semiconductor device comprising:

an electric conductor having a main surface and a rear surface that face mutually opposite sides in a thickness direction;

a semiconductor element including an element main body and a plurality of electrodes, the element main body having a first side facing the main surface of the electric conductor, the plurality of electrodes each protruding toward the main surface from the first side of the element main body and being electrically connected to the main surface; and a bonding layer held in contact with the main surface and the plurality of electrodes, wherein each of the plurality of electrodes includes: a base portion in contact with the element main body; and a columnar portion protruding toward the main surface from the base portion and held in contact with the bonding layer, the bonding layer is a sintered body of a metal powder, wherein the electric conductor comprises: a plurality of first leads that extend in a first direction orthogonal to the thickness direction and are separated from each other in a second direction orthogonal to the thickness direction and the first direction; and a plurality of second leads that are located offset from the plurality of first leads in the second direction, the semiconductor element includes a semiconductor substrate and a semiconductor layer disposed on the semiconductor substrate and facing the main surface, the semiconductor layer is formed with a switching circuit and a control circuit electrically connected to the switching circuit, the plurality of electrodes include a plurality of first electrodes and a plurality of second electrodes, the plurality of first electrodes are electrically connected to the switching circuit and are electrically connected to the plurality of first leads, and the plurality of second electrodes are electrically connected to the control circuit, and at least part of the plurality of second electrodes is electrically connected to the plurality of second leads.

12. The semiconductor device according to claim 11, further comprising a sealing resin that covers a part of each first lead, a part of each second lead and the semiconductor element, wherein the sealing resin has: a bottom surface that faces a same side as the rear surface in the thickness direction; and a pair of first side surfaces that are connected to the bottom surface and are spaced apart from each other in the first direction, the plurality of first leads each include a main portion that extends in the first direction and a pair of side portions that are connected to ends of the main portion in the first direction, each of the pair of side portions has a first end surface that faces in the first direction, the rear surface of each first lead is exposed from the bottom surface, the first end surfaces are exposed from the pair of first side surfaces so as to be flush with the first side surfaces, and a dimension in the second direction of the pairs of first end surfaces is smaller than a dimension in the second direction of the rear surfaces of the main portions.

13. The semiconductor device according to claim 12, wherein each of the pair of side portions is provided with wedge portions that extend from the main surface to the rear surface and are recessed inward of the side portions from both sides in the second direction.

14. The semiconductor device according to claim 12, wherein each of the pair of side portions is provided with a notch portion that extends from the main surface to the rear surface, is recessed in the first direction from the first end surface, and divides the first end surface into two regions.

15. The semiconductor device according to claim 12, wherein each of the plurality of second leads includes a second end surface facing in the second direction, the sealing resin includes a pair of second side surfaces that are connected to the bottom surface and the pair of first side surfaces and are spaced apart from each other in the second direction, the rear surfaces of the plurality of second leads are exposed from the bottom surface, and the plurality of second end surfaces are exposed from one of the second side surfaces so as to be flush with the one of the second side surfaces.

16. The semiconductor device according to claim 15, wherein
- one of the plurality of first leads is formed with a plurality of protruding portions that protrude from the main portion of the one of the plurality of first leads,
- each of the plurality of protruding portions includes an auxiliary end surface that faces in the second direction, and
- the auxiliary end surface of each protruding portion is exposed from the other of the second side surfaces so as to be flush with the other of the second side surfaces.

\* \* \* \* \*